United States Patent
Jin

(10) Patent No.: US 9,712,193 B1
(45) Date of Patent: Jul. 18, 2017

(54) HIGH POWER EFFICIENT AMPLIFIER THROUGH DIGITAL PRE-DISTORTION AND MACHINE LEARNING IN CABLE NETWORK ENVIRONMENTS

(71) Applicant: CISCO TECHNOLOGY, INC., San Jose, CA (US)

(72) Inventor: Hang Jin, Plano, TX (US)

(73) Assignee: CISCO TECHNOLOGY, INC., San Jose, CA (US)

(*) Notice: Subject to any disclaimer, the term of this patent is extended or adjusted under 35 U.S.C. 154(b) by 0 days.

(21) Appl. No.: 15/247,580

(22) Filed: Aug. 25, 2016

Related U.S. Application Data

(60) Provisional application No. 62/321,577, filed on Apr. 12, 2016.

(51) Int. Cl.
*H04L 25/49* (2006.01)
*H04B 1/04* (2006.01)

(52) U.S. Cl.
CPC ... *H04B 1/0475* (2013.01); *H04B 2001/0425* (2013.01)

(58) Field of Classification Search
CPC ........... H03F 1/3247; H03F 2201/3233; H03F 1/3241; H04L 27/368; H04L 27/367
USPC .................................................. 375/296, 297
See application file for complete search history.

(56) References Cited

U.S. PATENT DOCUMENTS

| | | | |
|---|---|---|---|
| 6,054,896 A | 4/2000 | Wright | |
| 6,570,444 B2 | 5/2003 | Wright | |
| 7,414,470 B2 | 8/2008 | Okazaki | |
| 9,270,231 B2 | 2/2016 | Utsunomiya et al. | |
| 9,276,617 B2 | 3/2016 | Schafferer et al. | |
| 2003/0058959 A1* | 3/2003 | Rafie | H03F 1/3247 375/296 |

(Continued)

OTHER PUBLICATIONS

Choi, S., et al., "Adaptive Predistortion With Direct Learning Based on Piecewise Linear Approximation of Amplifier Nonlinearity." IEEE Journal of selected topics in signal processing, vol. 3, No. 3, Jun. 2009, 8 pages; http://koasas.kaist.ac.kr/bitstream/10203/12085/1/65.pdf.

(Continued)

*Primary Examiner* — David S Huang
(74) *Attorney, Agent, or Firm* — Patent Capital Group

(57) ABSTRACT

An example method for facilitating a high power efficient amplifier through digital pre-distortion (DPD) in cable network environments is provided and includes receiving a first signal and a second signal at a DPD coefficient finder in an amplifier module, the second signal including transformations of the first signal from distortions due to channel effects and amplifier nonlinearity, synchronizing the first signal and the second signal, thereby removing the channel effects, computing a first vector representing an inverse of the nonlinearity of the amplifier, computing a second vector representing an inverse of some of the channel effects and providing DPD coefficients to a DPD actuator in the amplifier module, the DPD coefficients including the first vector and the second vector, the DPD actuator predistorting an input signal to the amplifier module with the DPD coefficients, such that an output signal from the amplifier module retains linearity relative to the input signal.

20 Claims, 17 Drawing Sheets

(56) References Cited

U.S. PATENT DOCUMENTS

2004/0179629 A1\* 9/2004 Song ............... H03F 1/3247
                                                    375/296
2005/0105642 A1  5/2005 Muller
2005/0258898 A1\* 11/2005 Hongo ............. H03F 1/3241
                                                    330/149

OTHER PUBLICATIONS

U.S. Appl. No. 15/352,438, filed Nov. 15, 2016, entitled "High Power Efficient Amplification at Cable Modems Through Digital Pre-Distortion and Machine Learning in Cable Network Environments," Inventor(s): Hang Jin, et al.
U.S. Appl. No. 1/535,2445, filed Nov. 15, 2016, entitled "System Architecture for Supporting Digital Pre-Distortion and Full Duplex in Cable Network Environments," Inventor(s): Hang Jin, et al.
USPTO Jan. 12, 2017 Non-Final Office Action from U.S. Appl. No. 15/352,438.

\* cited by examiner

```
function [delay0,delay_total,metric]=delay_calc(tx_rf0,tx_rf,t_step,max_sample,delay0)
% coarse search
course_window=30;
if(isempty(delay0)==1)
  mm=min(1000,length(tx_rf0));
  x=tx_rf0(100:mm);
  y=tx_rf(100:mm);
  cor=[];
  delay=[];
  for i=course_window:-1:1
    aa=x(i:end)'*y(1:end-i+1);
    cor=[cor,aa];
    delay=[delay,-i+1];
  end
  for i=2:course_window
    aa=y(i:end)'*x(1:end-i+1);
    cor=[cor,aa];
    delay=[delay,i-1];
  end
  [a,ind]=max(cor);
  delaya=delay(ind);
  delay_c=delaya-max_sample;
  nn=1/t_step;
  num_step=2*max_sample*nn;
  delay=delay_c-t_step;
else
  nn=1/t_step;
  num_step=2*nn+1;
  delay=delay0-(nn+1)*t_step;
end
delay_total=[];
metric=[];
n0=5;
for i=1:num_step
  delay=delay+t_step;
  tx_rf1=rf_chan_delay(tx_rf0,delay,1);
  metric0=norm(tx_rf1(n0+1:end-n0)-tx_rf(n0+1:end-n0));
  metric=[metric,metric0];
  delay_total=[delay_total,delay];
end
[a,ind]=min(metric);
delay0=delay_total(ind);
```

```
function [w,U,dq2,err] =weight_calc(U,dq2,w,beta,alpha,d,x)
xaux = conj(x);
Uaux = sqrt(beta)*U;
daux = conj(d);
dq2aux = sqrt(beta)*dq2;
gamma = 1;
N = length(x) -1;
for n = 1:N+1
    cos_theta = abs(Uaux(N+2-n,n))/sqrt(abs(xaux(n))^2+abs(Uaux(N+2-n,n))^2);
    sin_theta = conj(xaux(n)/Uaux(N+2-n,n))*cos_theta;
    Uaux(N+2-n,n)=sin_theta*xaux(n) + cos_theta*Uaux(N+2-n,n);
   gamma = gamma * cos_theta;
   for m = n+1:N+1
     oldxaux = xaux(m);
     xaux(m) = cos_theta*oldxaux - conj(sin_theta)*Uaux(N+2-n,m);
     Uaux(N+2-n,m) = sin_theta*oldxaux + cos_theta*Uaux(N+2-n,m);
   end
   olddaux = daux;
   daux = cos_theta*olddaux - conj(sin_theta)*dq2aux(N+2-n);
   dq2aux(N+2-n) = sin_theta*olddaux + cos_theta*dq2aux(N+2-n);
   summa = 0;
   if n > 1
     for m = 1:n-1
       summa = summa + Uaux(n,N+2-m)*w(N+2-m);
     end
   end
   w1(N+2-n,1) = (dq2aux(n)-summa)/Uaux(n,N+2-n);
end
w=(1-alpha)*w+alpha*w1;
U = Uaux;
gamma_k = gamma;
dq2 = dq2aux;
eq1 = daux;
err = conj(eq1)*gamma_k;
```

```
function [U,dq,w,err]=sync_func(tx_rf0,tx_rf,tau,U,dq,w,beta,alpha)
pre_exl=10;
tx_rf0=tx_rf0(pre_exl+1:end);
tx_rf=tx_rf(pre_exl+1:end);
err=[];
len_ref=length(w);
ref=zeros(len_ref,1);
iter_len=min(20000,length(tx_rf)-tau);
for n=1:iter_len;
   refn=tx_rf0(n);
   txn=tx_rf(n+tau);
   ref=[ref(2:end);refn];
   [U,dq,w,errn]=weight_update(U,dq,w,beta,alpha,txn,ref);
   err=[err;errn];
end
```
— 183

```
function [U,dq,w,err]=weight_update(U,dq,w,beta,alpha,sig,ref)
[n,m]=size(U);
m_sect=n/m;
wa=[]; Ua=[]; dqa=[];
err=sig;
for i=1:m_sect;
   m_off=(i-1)*m;
   ref2=ref(end-m_off:-1:end-m_off-m+1);
   wt=w(m_off+1:m_off+m);
   Ut=U(m_off+1:m_off+m,:);
   dqt=dq(m_off+1:m_off+m);
   [wt,Ut,dqt,err]=weight_calc(Ut,dqt,wt,beta,alpha,err,ref2);
   wa=[wa;wt];
   Ua=[Ua;Ut];
   dqa=[dqa;dqt];
end
w=wa;
U=Ua;
dq=dqa;
```
— 184

FIG. 17

```
function [tx_rf0a,tx_rfa]=rf_signal_sync(tx_rf0,tx_rf,tau,w)
len=length(w);
  tx_rf0a=[];
  len1=length(tx_rf0);
  tx_rf0a=conv(tx_rf0,w);
  tx_rf0a=tx_rf0a(len:len1-tau);
  tx_rfa=tx_rf(len+tau:length(tx_rf0a)+len+tau-1);
```

```
function tx_coef1=nonlinear_charc(num_y,y,x,del,fir_len,mi,ma,w0)
ind=find(num_y>0);
y_a=y(ind)./num_y(ind);
x_a=x(ind);
y_a=y_a-x_a;
num_add=fir_len+128;
x_left=(-num_add:-1)*del+x_a(1);
x_right=(1:num_add)*del+x_a(end);
y_left=ones(1,num_add)*y_a(1);
y_right=ones(1,num_add)*y_a(end);
x_a=[x_left,x_a,x_right];
y_a=[y_left,y_a,y_right];
nn=(x_a(end)-x_a(1))/del;
x0=x_a(1)+(1:(nn-1))*del;
y=interp1(x_a,y_a,x0,'linear','extrap');
len=length(y);
wn1=0.02;
b1=fir1(fir_len,wn1);
y1=conv(b1,y);
[aa,ind]=max(b1);
y1=y1(ind:ind+len-1);
wn2=0.002;
b2=fir1(128,wn2);
y2=conv(b2,y);
[aa,ind]=max(b2);
y2=y2(ind:ind+len-1);
w1=interp1(w0(:,1),w0(:,2),x0,'linear','extrap');
w2=1-w1;
y=y1.*w1+y2.*w2;
y=y+x0;
x0=x0(num_add+1:end-num_add);
y=y(num_add+1:end-num_add);
tx_coef1=[x0;y];
```

FIG. 19

```
function dpd_coef=dpd_coef_calc(dpd_coef0,tx_coef,lamda)
del=tx_coef(1,2)-tx_coef(1,1);
num_p=0.2/del;
option=1;
if(option==1)
  x=2; y=1; sign=1;
else
  x=1; y=2; sign=-1;
end
x0=tx_coef(x,:);
y0=tx_coef(y,:);
dpd_x=dpd_coef0(1,:);
mi=dpd_x(1);
ma=dpd_x(end);
order=1;
if(x0(1)>mi)
  p=polyfit(x0(1:num_p),y0(1:num_p),order);
  x1=mi;
  y1=p(order+1);
  for j=1:order
   ind=order-j+1;
   y1=y1+p(j)*x1.^ind;
   end
  x0=[x1,x0];
  y0=[y1,y0];
end
if(x0(end)<ma)
  p=polyfit(x0(end-num_p+1:end),y0(end-num_p+1:end),order);
  x2=ma;
  y2=p(order+1);
  for j=1:order
   ind=order-j+1;
   y2=y2+p(j)*x2.^ind;
   end
  x0=[x0,x2];
  y0=[y0,y2];
end
dpd_coef_y=interp1(x0,y0,dpd_x,'linear','extrap');
dpd_update=dpd_coef_y-dpd_x;
dpd_update=lamda*sign*dpd_update;
dpd_coef=[dpd_x;dpd_coef0(2,:)+dpd_update];
```

```
function dpd_coef_trial=dpd_coef_trial_calc(dpd_coef, dpd_coef1,alpha)
a1=dpd_coef1.*dpd_coef;
v1s=dpd_coef1-a1*dpd_coef;
dpd_coef_trial=alpha*v1s+a1*dpd_coef;
```

HIGH POWER EFFICIENT AMPLIFIER THROUGH DIGITAL PRE-DISTORTION AND MACHINE LEARNING IN CABLE NETWORK ENVIRONMENTS

CROSS-REFERENCE TO RELATED APPLICATION

This application claims the benefit of priority under 35 U.S.C. §119(e) to U.S. Provisional Application Ser. No. 62/321,577 entitled "DIGITAL PRE-DISTORTION MECHANISMS IN CABLE NETWORKS," filed Apr. 12, 2016, which is hereby incorporated by reference in its entirety.

TECHNICAL FIELD

This disclosure relates in general to the field of communications and, more particularly, to a high power efficient amplifier through digital pre-distortion (DPD) and machine learning in cable network environments.

BACKGROUND

Driven by 50% growth rate in bandwidth consumption, cable network operators are increasingly focused on cost-performance of the Hybrid Fiber Coaxial (HFC) network. Consumers are expected to turn to progressively higher volume of Internet Protocol content and services. As a result, cable network operators are seeking technology solutions that provide a low cost per bit for their cable networks. A dominant part of the cost is electrical power consumption by various components in the network. The cost of electrical power to the cable industry is approximately $1B in 2015, and expected to rise to $4B in 2020. A majority of the power is consumed by HFC amplifiers in the cable network. Amplifiers are provided along the cables to boost signal power. For example, an average of ten amplifiers are provided along a length of three miles, or thereabouts, throughout the cable network. Yet, typical amplifiers have low power efficiency, leading to greater power consumption with no proportionate increase in throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 15 is a simplified algorithm illustrating yet other example operations that may be associated with embodiments of the communication system;

FIG. 16 is a simplified algorithm illustrating yet other example operations that may be associated with embodiments of the communication system;

FIG. 17 is a simplified algorithm illustrating yet other example operations that may be associated with embodiments of the communication system;

FIG. 18 is a simplified algorithm illustrating yet other example operations that may be associated with embodiments of the communication system;

FIG. 19 is a simplified algorithm illustrating yet other example operations that may be associated with embodiments of the communication system;

FIG. 20 is a simplified algorithm illustrating yet other example operations that may be associated with embodiments of the communication system;

DETAILED DESCRIPTION OF EXAMPLE EMBODIMENTS

Overview

An example method for a high power efficient amplifier through DPD and machine learning in cable network environments is provided and includes receiving a first signal and a second signal at a DPD coefficient finder in an amplifier module, the second signal including a transformation (e.g., conversion, change, modification, etc.) of the first signal based on distortions (e.g., alterations, adjustments, variations, etc.) due to channel effects and amplifier nonlinearity, the first signal being transformed into the second signal after passing in sequence through a pre-network circuit, an amplifier, and a post-network circuit. The pre-network circuit and the post-network circuit introduces distortions due to channel effects and the amplifier introduces distortions due to nonlinearity. The method further includes synchronizing the first signal and the second signal, for example, by removing the channel effects of the pre-network circuit and the post-network circuit, computing a first vector representing an inverse of the nonlinearity of the amplifier, computing a second vector representing an inverse of the channel effects of the pre-network circuit, and providing DPD coefficients to a DPD actuator in the amplifier module, the DPD coefficients including the first vector and the second vector. The DPD actuator predistorts an input signal to the amplifier module with the DPD coefficients, such that an output signal from the amplifier module retains linearity relative to the input signal.

As used herein, "channel effects" can include fraction delay, time offset between input and output signals, reflection, frequency dependent channel response, signal leakage, thermal noise, phase noise and any other parameter that distorts signals traversing the amplifier module according to a predominantly linear mathematical relationship (e.g., non-linear effects on the signals being negligent compared to the linear effect). As used herein, the term "vector" refers to a list of data items, for example, a one-dimensional array, and can represent one-dimensional time or frequency dependent signals (or functions). The term "coefficient" expresses a numerical or constant quantity placed before and multiplying a variable in an algebraic expression (e.g., 4 in $4x^y$).

Example Embodiments

Figure 1:
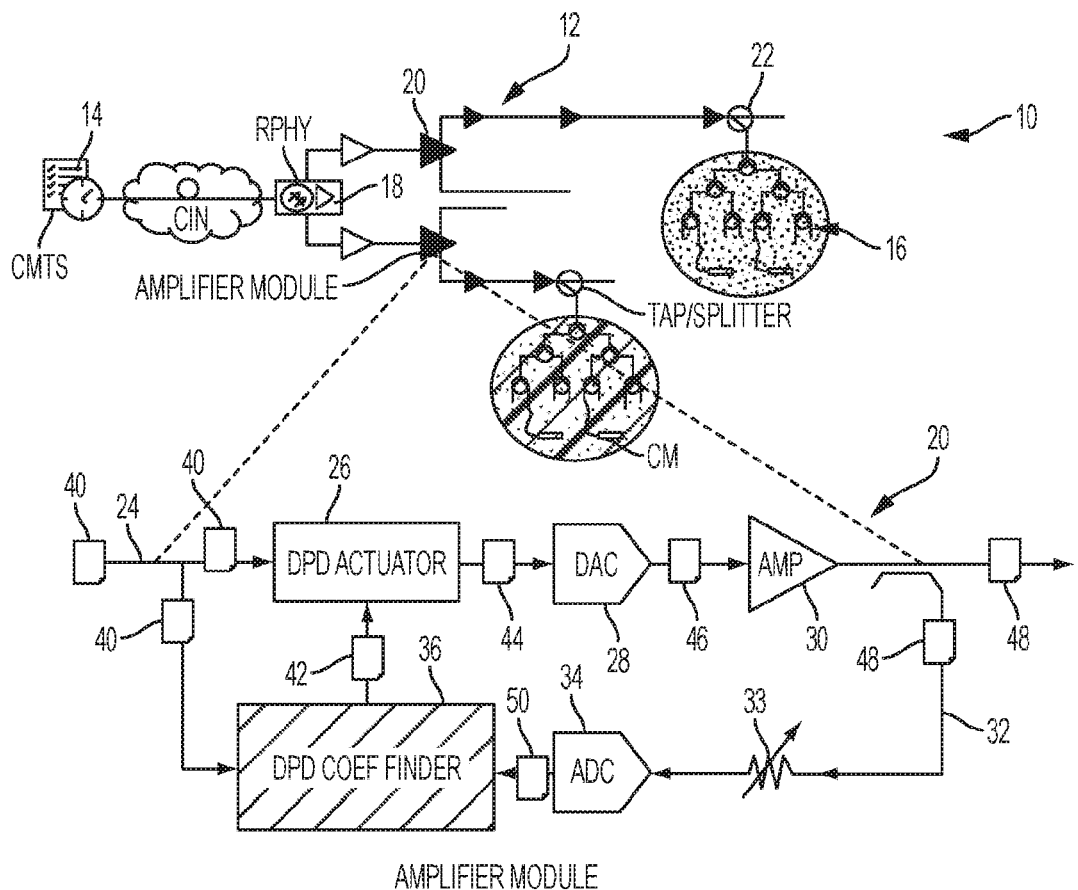
FIG. 1 is a simplified block diagram illustrating a communication system facilitating a high power efficient amplifier through DPD and machine learning in cable network environments.

Turning to FIG. 1, FIG. 1 is a simplified block diagram illustrating a communication system 10 enabling a high power efficient amplifier through digital pre-distortion and machine learning in cable network environments in accordance with one example embodiment. FIG. 1 illustrates a cable network 12 (indicated generally by an arrow) facilitating communication between a cable modem termination system (CMTS) 14 and one or more cable modems (CMs) 16. Network 12 includes transceivers 18, amplifier modules 20, and taps and splitters 22.

According to various embodiments, amplifier modules 20 may be incorporated into transceivers 18 and stand-alone Hybrid-Fibre Coaxial (HFC) radio frequency (RF) amplifiers. In a general sense, network 12 may comprise a plurality of amplifier modules 20. An example amplifier module 20 is shown in greater detail in the figure. Amplifier module 20 includes, on a transmit (TX) line 24: a digital pre-distortion (DPD) actuator 26, a digital to analog converter (DAC) 28 and an amplifier 30. On a reference line 32 is included an analog-to-digital converter (ADC) 34, and a DPD coefficient (coef) finder 36.

According to various embodiments, an input signal 40 (in digital domain) entering amplifier module 20 is forked (e.g., copied, bifurcated, split, branched, separated, sampled, etc.) into DPD coef finder 36, which outputs DPD coef 42 to DPD actuator 26. Note that in a general sense, signals flowing through cable network 12 comprise RF signals in multiple frequencies. For example, the RF signals may comprise digital data carried in at least two carrier waves of differing frequencies. The RF signals may be converted into the digital domain (e.g., using ADCs) before being input to amplifier module 20. As used herein, "signal" denotes an electrical signal comprising a voltage or current; signals described herein can comprise analog signals (RF signals being an example) or digital signals.

DPD actuator 26 distorts input signal 40 using DPD coef 42 to generate pre-distorted signal 44. Pre-distorted signal 44 is converted to analog signal 46 by DAC 28. Analog signal 46 is amplified by amplifier 30 into amplified signal 48. As used herein, the term "amplifier" refers to an electrical or electronic circuit that increases the power of an electrical signal, such as a RF signal. In a general sense, the amplifier modulates the output of a power supply (e.g., source of electrical signals) to make the output signal stronger than the input signal. In various embodiments, amplifier 30 comprises a RF amplifier operating in a frequency range between 20 kHz and 300 GHz.

Amplifier 30 introduces distortion into analog signal 46 in the amplification process due to its inherent properties, construction, and/or configuration. Amplified signal 48, which is output from amplifier 30, is forked into reference line 32, and converted into digital reference signal 50 in the digital domain by ADC 34. Reference signal 50 is fed to DPD coef finder 36, which compares reference signal 50 with input signal 40 to generate DPD coef 42. The process is performed iteratively until values of DPD coef 42 are such that any distortions due to amplifier 30 are canceled out (e.g., eliminated, reduced, etc.).

Typical amplifiers used in cable networks, such as cable network 12, include high linearity low efficiency Class A amplifiers. High efficiency low linearity Class AB amplifiers may be used in cable networks but their non-linearity must be corrected to meet cable industry RF fidelity requirements (amplifier classes represent the amount of the output signal varying within the amplifier circuit over one cycle of operation when excited by a sinusoidal input signal).

A class-A amplifier is distinguished from other power amplifiers by the output stage device being biased for class A operation. Generally, the class A amplifier uses a single transistor (e.g., Bipolar, field effect transistor (FET), insulated-gate bipolar transistor (IGBT), etc.) connected in a common emitter configuration for both halves of an input waveform signal. The amplification process in Class-A is inherently linear. To achieve high linearity and gain, the output stage of a class A amplifier is biased "ON" (conducting) all the time. In other words, the transistor always has current flowing through it, even if it has no base signal. This means that the output stage is never driven fully into its cut-off or saturation regions but instead has a base biasing Q-point in the middle of its load line. Thus the transistor never turns "OFF" which is one of its main disadvantages. Due to this continuous loss of power, the class A amplifier generates large amount of heat adding to its low efficiency.

A class AB amplifier includes two transistors providing a push-pull operation, with each transistor operating similar to a class B amplifier, amplifying a complementary half (e.g., either positive half or negative half of sinusoidal signal) of the input signal. In a Class B amplifier, when the input signal goes positive, a positive biased transistor conducts while a negative biased transistor is switched "OFF". Likewise, when the input signal goes negative, the positive biased transistor switches "OFF" while the negative biased transistor turns "ON" and conducts the negative portion of the signal. In the class AB amplifier, each transistor will be ON for more than half a cycle, but less than a full cycle of the input signal, leading to better power efficiency than the Class A amplifier. However, signal distortion is introduced at a cross-over region (between one transistor turning OFF and the other turning ON), typically between −0.7V and +0.7V. Thus, Class AB has higher efficiency than Class-A at the price of linearity.

Traditional pre-distortion mechanisms attempt to correct for non-linear transfer characteristics of the amplifier by forming an inverse model of its transfer characteristic. The inverse model is applied to the low-level (unamplified) signal at the input of the amplifier in a nonlinear memoryless function to pre-distort the signal such that the amplified signal appears undistorted. The nonlinear memoryless function is updated periodically to account for variations in the amplifier transfer characteristics by monitoring the output from the amplifier.

Typical digital pre-distortion (DPD) systems use a digital signal processing (DSP) block to pre-distort the input signal before upconversion to the RF domain and amplification. In some systems, digital samples of the input signal to the amplifier and the output signal from the amplifier are captured are fed to an estimator that calculates correction coefficients used by the DSP block to pre-distort the input signal. Due to the inherent limitations of the electronic circuitry, such traditional systems are limited in operation to 5 MHz signal bandwidth to meet standards of signal-to-noise ratio (SNR) performance of the network.

To overcome the bandwidth limitations, at least one known system modifies the existing circuitry using different DACs to separately convert the input signal and the error correction signal (provided by the estimator to the DSP block). By reducing the power and/or bandwidth to be handled by any one DAC, available levels of quantization of the DAC are applied to a lower power signal, resulting in improved signal to noise ratio (as compared to systems that do not use separate DACs). The input signal is additionally separated into two or more sub-bands of narrower bandwidth; each of the sub-bands is converted to analog using a separate DAC. Each digital sub-band is passed through a correction filter, which is driven by the estimator to compensate for relative gain, phase, and delay inconsistencies between the different sub-bands. The technique relies on multiple DACs and multiple analog filters, which can lead to complicated circuitry.

Embodiments of communication system 10 can resolve such issues by enabling high fidelity (e.g., high linearity), high power-efficient amplifiers through digital pre-distortion and machine learning. According to embodiments of communication system 10, input signal 40 is pre-distorted to compensate for any nonlinearity of amplifier 30. The pre-distortion is applied before or after a modulator (not shown) in the transmitter (e.g., if amplifier module 20 is located at a transmitter, for example, in transceiver 18) or amplifier 30.

Snap shots (e.g., samples) of input signal 40 and output signal 50 of amplifier module 20 are taken. Predistortion coefficients namely DPD coef 42 are computed (e.g., determined, calculated, etc.) by comparing the snap shots. The comparison is performed such that channel effects (e.g., fraction delay, time offset of the input and output signals, reflection, frequency dependent channel response, leakage of upstream signal, inherent noise (e.g., thermal/phase noise) of amplifier module 20, etc.) are compensated for. The computation is performed iteratively.

When new coefficients are obtained in an iteration starting out with old coefficients (e.g., coefficients computed in the preceding iteration), a coefficient 'update direction' is determined (e.g., computed) from the old and new coefficients. A step (e.g., small step in terms of magnitude) in the 'update direction' is taken to obtain trial coefficients. The trial coefficients are used as DPD coef 42 to predistort input signal 40. The signal quality (e.g., modulation error ratio (MER), adjacent channel power ratio (ACPR)) of output signal 48 is computed. If the signal quality improved, the new coefficients are used; otherwise, the new coefficients are discarded in favor of the old coefficients. The iterative steps are repeated until a preconfigured signal quality is obtained.

Turning to the infrastructure of communication system 10, the network topology can include any number of cable modems, customer premises equipment, servers, switches (including distributed virtual switches), routers, amplifiers, taps, splitters, combiners and other nodes inter-connected to form a large and complex network. Network 12 represents a series of points or nodes of interconnected communication pathways for receiving and transmitting packets and/or frames of information that are delivered to communication system 10. A node may be any electronic device, computer, printer, hard disk drive, client, server, peer, service, application, or other object capable of sending, receiving, amplifying, splitting, or forwarding signals over communications channels in a network. Elements of FIG. 1 may be coupled to one another through one or more interfaces employing any suitable connection (wired or wireless), which provides a viable pathway for electronic communications. Additionally, any one or more of these elements may be combined or removed from the architecture based on particular configuration needs.

Cable network 12 offers a communicative interface between cable network components, and may include any local area network (LAN), wireless local area network (WLAN), metropolitan area network (MAN), Intranet, Internet, Extranet, wide area network (WAN), virtual private network (VPN), or any other appropriate architecture or system that facilitates communications in a network environment. Network 12 may implement any suitable communication protocol for transmitting and receiving data packets within communication system 10. The architecture of the present disclosure may include a configuration capable of DOCSIS, TCP/IP, TDMA, and/or other communications for the electronic transmission or reception of signals in a network. The architecture of the present disclosure may also operate in conjunction with any suitable protocol, where appropriate and based on particular needs. In addition, gateways, routers, switches, and any other suitable nodes (physical or virtual) may be used to facilitate electronic communication between various nodes in the network.

In some embodiments, a communication link may represent any electronic link supporting a network environment such as, for example, cable, Ethernet, wireless technologies (e.g., IEEE 802.11x), ATM, fiber optics, etc. or any suitable combination thereof. In other embodiments, communication links may represent a remote connection through any appropriate medium (e.g., digital subscriber lines (DSL), coaxial fiber, telephone lines, T1 lines, T3 lines, wireless, satellite, fiber optics, cable, Ethernet, etc. or any combination thereof) and/or through any additional networks such as a wide area networks (e.g., the Internet).

Note that the numerical and letter designations assigned to the elements of FIG. 1 do not connote any type of hierarchy; the designations are arbitrary and have been used for purposes of teaching only. Such designations should not be construed in any way to limit their capabilities, functionalities, or applications in the potential environments that may benefit from the features of communication system 10. It should be understood that communication system 10 shown in FIG. 1 is simplified for ease of illustration.

In particular embodiments, CMTS 14 may comprise a hardware appliance with appropriate ports, processors, memory elements, interfaces, and other electrical and electronic components that facilitate the functions described herein, including providing high speed data services, such as cable Internet or voice over Internet Protocol (e.g., in the form of digital, RF, or other suitable signals) to cable subscribers, such as cable modems 16. In various embodiments, CMTS 14 comprises a Universal Broadband Router (uBR) with features that enable it to communicate with a Hybrid Fiber Coaxial (HFC) cable network via a suitable cable modem card, which provides an interface between the uBR protocol control information (PCI) bus and radio frequency (RF) signals on the DOCSIS HFC cable network.

In some embodiments, CMTS 14 may comprise a converged cable access platform (CCAP) core that transmits and receives digital signals in IP protocols, coupled with one or more physical interface (PHY) transceiver(s), such as transceiver 18 that convert the digital IP signals into RF signals, and vice versa. The PHY transceivers, such as transceiver 18, may be co-located with the CCAP core at a common location, or may be located remote from the CCAP core and connected over a converged interconnect network (CIN). In some embodiments, CMTS 14 may comprise a single CCAP core and a plurality of PHY transceivers, such as transceiver 18. CMTS 14 is connected (e.g., communicatively coupled, for example, through wired communication channels) to cable modems 16, transceiver 18, and amplifier modules 20 in cable network 12.

Transceivers 18 may comprise suitable hardware components and interfaces for facilitating the operations described herein. In some embodiments, transceivers 18 may be embedded in or be part of another hardware component, such as a broadband processing engine comprising a motherboard, microprocessors and other hardware components. In some embodiments, transceivers 18 comprise downstream and upstream PHY modules, deployed in a Coaxial Media Converter (CMC) that supports RF functions at the PHY layer. Transceivers 18 may comprise pluggable modules (e.g., small form-factor pluggable (SFP)) that may be plugged into a network element chassis, or embedded modules that attach to cables directly. In addition to optical and electrical interfaces, transceivers 18 include a PHY chip, appropriate digital signal processors (DSPs) and application specific integrated circuits (ASICs) according to particular needs. In various embodiments, the DSPs in transceivers 18 may be adapted (e.g., programmed) to perform appropriate interference cancellation and DPD coefficient calculation as described herein.

Amplifier modules 20 comprise RF amplifiers suitable for use in cable network 12. Amplifier modules 20 may be used at intervals in network 12, for example, to overcome cable attenuation and passive losses of electrical signals caused by various factors (e.g., splitting or tapping the coaxial cable). Amplifiers 30 comprised in amplifier modules 20 may include trunk amplifiers, distribution amplifiers, line extenders, house amplifier and any other suitable type of amplifier used in cable networks.

In various embodiments, DPD actuator 26 comprises a digital signal processor (DSP), field-programmable gate array (FPGA) integrated circuit, application specific integrated circuit (ASIC), or other suitable integrated circuit configured to receive input signals, process (e.g., modify, adjust, etc.) them using DPD coef 42 and generate output signal 44 in the digital domain. In some embodiments, DPD coef finder 36 may comprise an ASIC, DSP or other processor configured to perform the operations as described herein.

Figure 2:
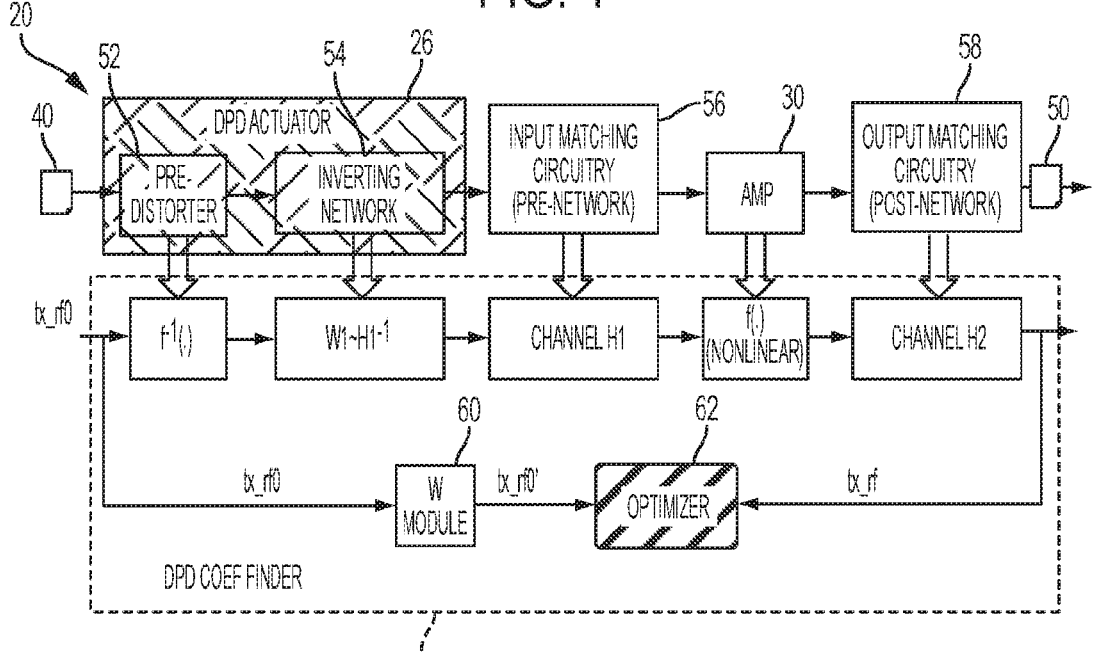
FIG. 2 is a simplified block diagram illustrating other example details of embodiments of the communication system.

Turning to FIG. 2, FIG. 2 is a simplified diagram illustrating example details of a logical arrangement of amplifier module 20 according to an embodiment of communication system 10. DPD actuator 26 comprises a pre-distorter 52 and an inverting network 54. The electrical and RF circuitry preceding amplifier 30 and subsequent to DPD actuator 26 (e.g., circuit comprises DAC 28 and any other appropriate component, such as noise inducers, resistive elements, etc.) may be represented by an input-matching circuitry 56 also referred to as "pre-network," which introduces channel effects. Likewise, the electrical and RF circuitry following amplifier 30 on reference line 32 (e.g., circuit may include RF downconverter, ADC 34, etc.) may be represented by an output matching circuitry 56 also referred to as "post-network."

Amplifier 30 may be represented logically (e.g., mathematically, algorithmically) by a nonlinear function f(.). Pre-network 56 may be represented logically by a channel function H1. In various examples, H1 may represent undesirable interferences and disturbances that corrupts input signal 40 before it reaches amplifier 30. H1 can also represent multiple frequencies comprised in input signal 40. In a general sense, H1 may represent a channel emulator. For example, H1 may represent a channel impulse response (CIR) such as:

$$H1(t) = \sum_{i=0}^{M-1} \alpha_i(t)\delta(t - \tau_i)$$

where $\alpha_i(t)$ is the ith complex channel tap coefficient of input signal 40, $\delta$ is the Dirac delta function representing the impulse signal, $\tau_i$ is the delay of the ith tap, and M is the number of resolvable taps. Each tap in the CIR shows delay, attenuation and phase shift introduced to the signal, and may be emulated using appropriate filters, attenuators, delay elements, etc. Post-network 58 may be represented logically by another channel function H2.

In a general sense, DPD mechanisms are used to find amplifier non-linearity f(.) and invert it in the digital domain so as to make the overall block of DPD actuator+amplifier appear more linear. In various embodiments, the DPD mechanism includes sampling the RF signal (digitized to input signal 40) before and after amplification, and, based on the sample differences, extracting amplifier nonlinearity. The RF signal sampled after amplification not only bears the characteristics of the amplifier nonlinearity, but also includes effects of the pre-network CIR H1 and the post network CIR H2. In some use-cases (e.g., based on the data carried in the signal), the effects of the H1 and H2 on the RF signal may be more dominant than the amplifier nonlinearity. For example, the nonlinearity may distort the RF signal and generate noise that is 45 dBc below a desired signal level, but discontinuities in HFC may create reflections with level 30 dBc, or 15 dB above the noise generated by non-linearity.

Further, the frequency dependent input and output impedance matching circuitries may create 'memory effect' in the output signal, that is, the output at the current (e.g., present) time depends on the inputs of previous times. Moreover, any fractional delay occurring between input and output will make the output signal appear totally different from the input signal. Such effects (e.g., reflection, frequency dependent channel, fractional delay) may be suitably modeled as H1 and H2. In various embodiments, H1 and H2 may comprise linear functions, represented by corresponding linear networks. In other words, H1 and H2 together may logically represent all linear distortions on input signal 40 within amplifier module 20.

Pre-distorter 52 represents a logical circuit that modifies input signal 40 according to an inverse function of f(.), namely $f^{-1}(.)$. Inverting network 54 comprises an inverting function W1 that approximates an inverse function of CIR H1 (e.g., W1~H1$^{-1}$, where H$^{-1}$*H1=U, unitary matrix). Input signal 40 may be represented as tx_rf0, and output signal 50 out of post-network 58 may be represented as tx_rf. In other words, tx_rf0 subjected to functions $f^{-1}(.)$, W1, H1, f(.) and H2 is transformed into tx_rf:

$$tx\_rf = H2 * f(.) * H1 * tx\_rf0, \text{ where * stands for convolution operation.}$$

Synchronizing tx_rf and tx_rf0 (in time) can be indicative of the nonlinear function f(.). Synchronizing procedure according to an example embodiment may comprise finding a vector w that minimizes the following objective function:

$$w * tx\_rf0 - tx\_rf$$

In other words, w represents a virtual network that behaves substantially identically to a combination of H1 and H2, such that any differences between w*tx_rf0 and tx_rf represents the nonlinearity f(.) of amplifier 30. The virtual network is represented as a W module 60, which comprises convoluting vector w, representing mathematical approximations H1 and H2. tx_rf0 convoluted with w may be represented as tx_rf0', which may be compared with tx_rf in an optimizer 62. The optimizing process can comprise any suitable mathematical method known in the art, for example, linear regression, or root least square (RLS). For optimization purposes, the reference function is tx_rf0, the observation function is tx_rf, and w is the coefficient sought. Optimizer 62 provides substantially accurate values for convoluting vector w, which can, in turn, be used to determine $f^{-1}(.)$.

In various embodiments, the amplifier nonlinearity is characterized with the input-output signal level relationship in 2×1024 vector format:

$$X=[x0, x1, \ldots, x1023]; Y=[y0, y1, \ldots, y1023];$$

where xi, i=0,1, . . . ,1023 are the input signal level (real numbers), and yi, i=0,1, . . . ,1023 are the output signal level (real numbers). xi, i=0,1, . . . ,1023 are evenly spaced. At each input level xi (i=0,1, 2, . . . , 1023), multiple output level observations due to noise are averaged to give the corresponding yi (i=0,1, 2, . . . , 1023). $f^{-1}(.)$ is obtained by inverting the nonlinearity curve:

$$f^{-1}(.) = [X, X - \lambda * (Y - X)]$$

where λ is a damping factor, 0<λ<=1. $f^{-1}(.)$ maps data points to inverts f(.), point by point instantaneously, without any 'memory' effect.

Figure 3:
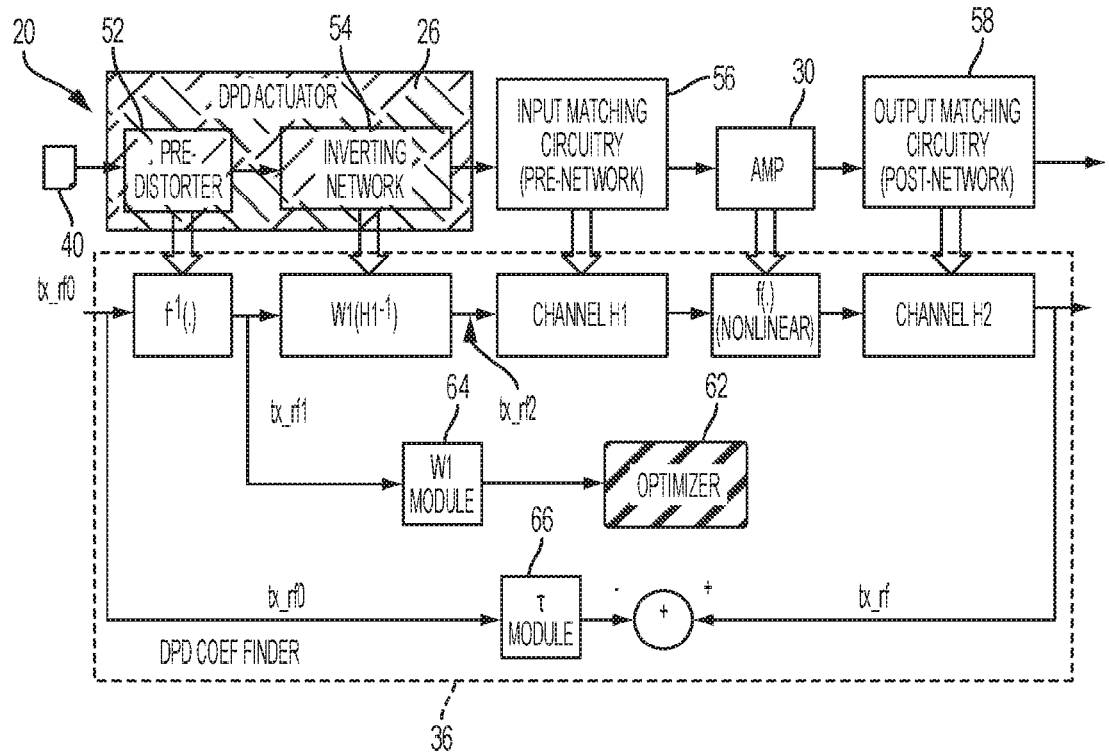
FIG. 3 is a simplified block diagram illustrating yet other example details of embodiments of the communication system.

Turning to FIG. 3, FIG. 3 is a simplified diagram illustrating example details of a logical arrangement of amplifier module 20 according to an embodiment of communication system 10. Pre-network H1 exhibits certain (e.g., non-zero) frequency dependent response, and causes signal spread over time, i.e., signal at the current time depends on signals in previous times. To apply DPD coef 42 effectively, the effect of the pre-network is removed in various embodiments as follows. tx_rf0 subjected to inverting function $f^{-1}(.)$ may be represented as tx_rf1. Using tx_rf1 as the reference and tx_rf−tx_rf0(delayed) as the observation, a function W1 is optimized using the following objective function:

$$\min \| tx\_rf - tx\_rf0(t - \tau r) \|$$

which can also be written as:

$$\min \| f(tx\_rf1 * W1 * H1) * H2 - tx\_rf0(t - \tau) \|$$

where * stands for convolution function, and f(.) represents amplifier non-linearity of amplifier 30. W1 module 64 convolutes and computes tx_rf1 with W1, and computes tx_rf1*W1. Time delay module 66 introduces a time delay τ according to the following relation: τ=ceiling(τ0)+1~3, where τ0 is a delay estimation between tx_rf1*W1 and tx_rf. (Note that ceiling function or ceiling(x), also represented as ⌈x⌉ is the smallest integer greater than or equal to x). Optimizer 62 performs optimization appropriately to minimize differences between tx_rf and tx_rf0(t−τ). The result of the process is vector W1, which approximates H1$^{-1}$.

Figure 4:
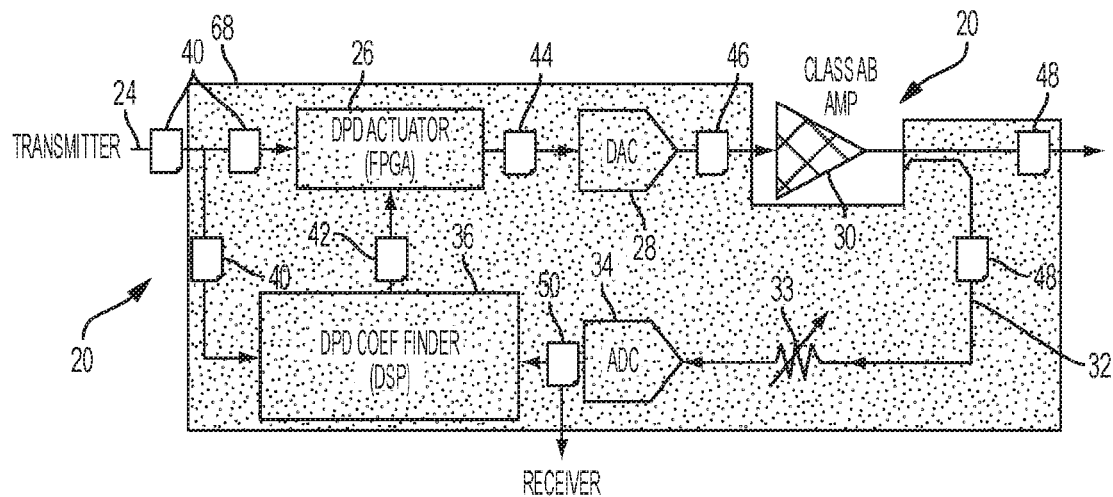
FIG. 4 is a simplified block diagram illustrating yet other example details of embodiments of the communication system.

Turning to FIG. 4, FIG. 4 is a simplified diagram illustrating example details of a hardware implementation of amplifier module 20 according to an embodiment of communication system 10. A hardware module 68, comprising a printed circuit board, a boxed module, etc. may include DPD actuator 26, DAC 28, ADC 34 and DPD coef finder 36. DPD actuator 26 may be implemented appropriately on a FPGA; DPD coef finder 36 may be implemented appropriately on a DSP in some embodiments. Hardware module 68 may be connected to a pre-existing Class AB amplifier 30 in cable network 12 with minimal changes to the network configuration. Thus, existing non-linear amplifiers may be upgraded to improve linearity using pluggable hardware module 68.

Figure 5:
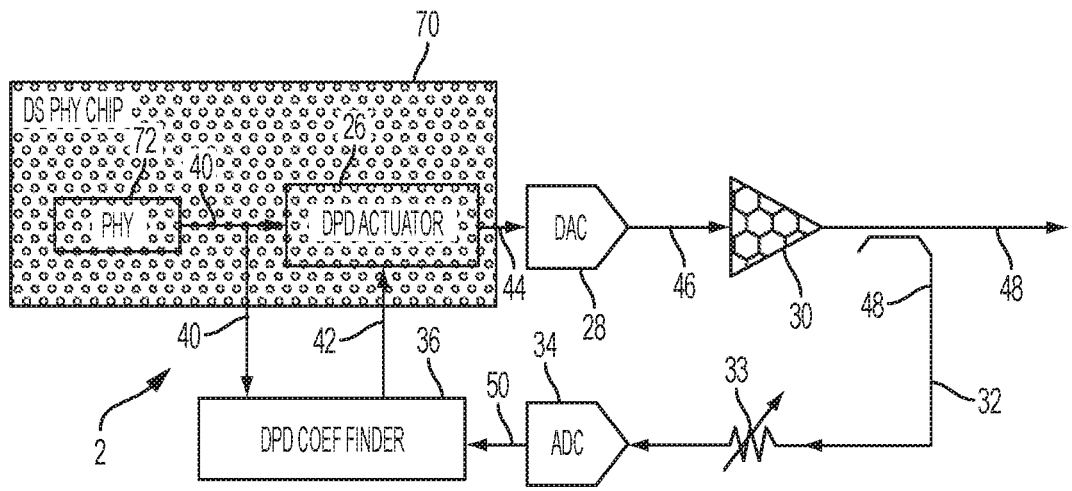
FIG. 5 is a simplified block diagram illustrating yet other example details of embodiments of the communication system.

Turning to FIG. 5, FIG. 5 is a simplified diagram illustrating example details of a hardware implementation of amplifier module 20 according to an embodiment of communication system 10. In some embodiments, DPD actuator 26 may be integrated into a downstream (DS) PHY chip (semiconductor circuit) 70 comprising a PHY module 72 including transmission components. DS PHY chip 70 may comprise an available off-the-shelf component in some embodiments. In other embodiments, DS PHY chip 70 may comprise a pre-configured integrated circuit tailored to meet certain cable network customer requirements. In such embodiments, DAC 28, DPD coef finder 36 and ADC 34 may be implemented in a separate pluggable module, which is connected appropriately to DS PHY chip 70 and amplifier 30 over appropriate interfaces (e.g., pins).

Figure 6:
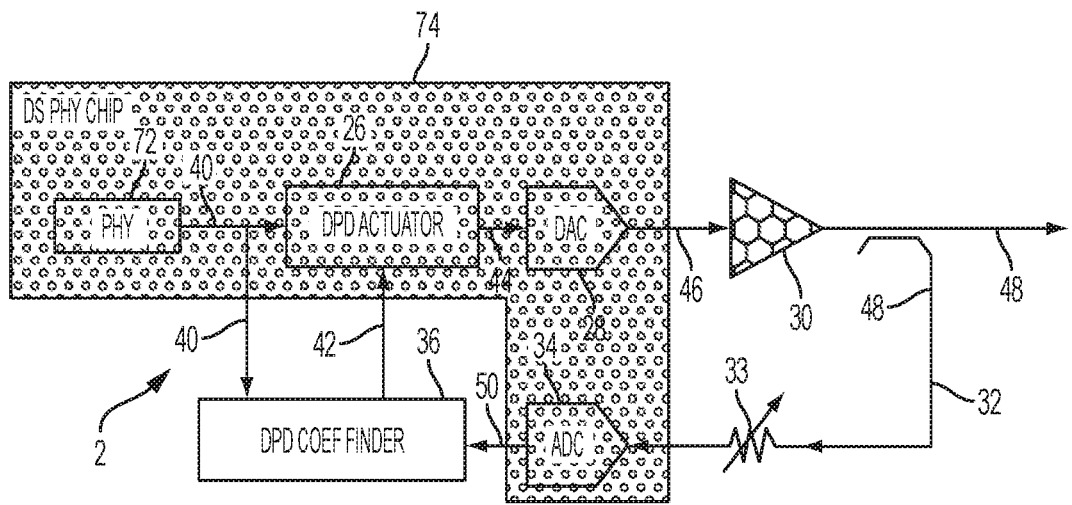
FIG. 6 is a simplified block diagram illustrating yet other example details of embodiments of the communication system.

Turning to FIG. 6, FIG. 6 is a simplified diagram illustrating example details of a hardware implementation of amplifier module 20 according to an embodiment of communication system 10. In some embodiments, PHY module 72, DPD actuator 26, DAC 28 and ADC 34 may be implemented on a single hardware module 74. Hardware module 74 may comprise a printed circuit board, an integrated chip, a pluggable module, etc. DPD coef finder 36 may be connected suitably to hardware module 74 over appropriate interfaces.

Figure 7:
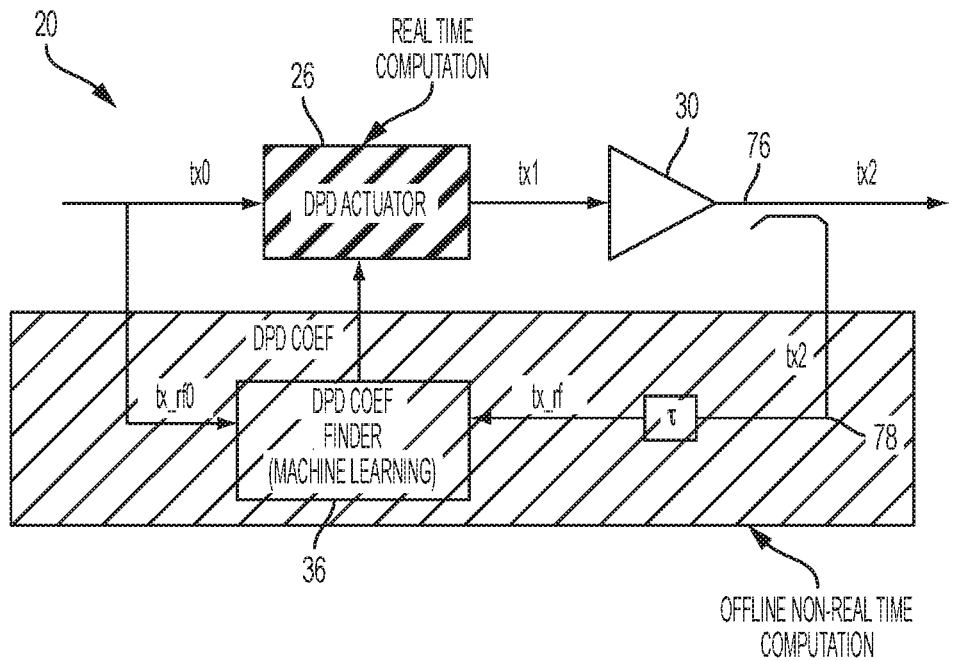
FIG. 7 is a simplified block diagram illustrating yet other example details of embodiments of the communication system.

Turning to FIG. 7, FIG. 7 is a simplified diagram illustrating example details of amplifier module 20 according to an embodiment of communication system 10. DPD actuator 26 stored DPD coef 42 and predistorts input signal (tx0) in real time, using the stored DPD coef 42. The predistorted signal (tx1) is amplified by amplifier 30 to signal tx2 in a main signal line 76 (see, e.g., transmit line 24). Periodically (e.g., at preconfigured intervals or at preconfigured network conditions, or at preconfigured environmental conditions), input reference signal (tx_rf0) and output signal (tx2) are forked from main signal line 76 into a DPD line 78 (see, e.g., reference line 32). Output signal tx2 is subjected to a delay (τ) to generate signal tx_rf. Input reference signal (tx_rf0) and signal tx_rf are used by DPD coef finder 36 to generate updated DPD coef 42 off-line in non-real time.

"Off-line" as used herein refers to a status of a device (e.g., DPD coef finder 36) that is disconnected from main signal line 76 (e.g., path through DPD actuator 26 and amplifier 30; transmit line 24); in other words, DPD coef finder 36 is not available for immediate use in real-time, on demand by DPD actuator 26. Off-line computation of DPD coef 42 is not time-constrained to signals on main signal line 76; moreover, off-line computation may be performed to selected signals only (e.g., samples). In contrast, real-time processing of input signals is performed constantly, to all signals as they traverse through main signal line 76. Moreover, DPD actuator 26 does not immediately control DPD coef finder 36 and read DPD coef 42 continuously; rather, DPD coef finder 36 may compute DPD coef 42 at predetermined intervals (or events) and feed them to DPD actuator 26. Thus, computation of DPD coef 42 takes place independently of DPD actuator 26.

In some embodiments, DPD coef 42 is updated once every x seconds, x being pre-configured by an operator. DPD coef finder 36 is implemented on an integrated chip (e.g., FPGA) that can handle certain data rate (e.g., 48 Gbps, >48 GHz*bit), buffer data suitably (e.g., 1 ms), and handle the appropriate amount of data (e.g., 12 MB) from transmitter and to receiver, with sufficient FLOPs for real LUT operation. In many embodiments, DPD coef finder 36 uses machine learning algorithm to update DPD coef 42. For example, an update direction is determined from input reference signal tx_rf0 and signal tx_rf. A small step (e.g., perturbation) is made in the update direction to obtain trial coefficients. The trial coefficients are used to pre-distort signal tx_rf0. A signal quality of the output signal based on the predistorted signal is computed. If the signal quality is better than previously, DPD coef 42 are updated to the trial coefficients, otherwise, the DPD coef 42 are not updated.

Figure 8:
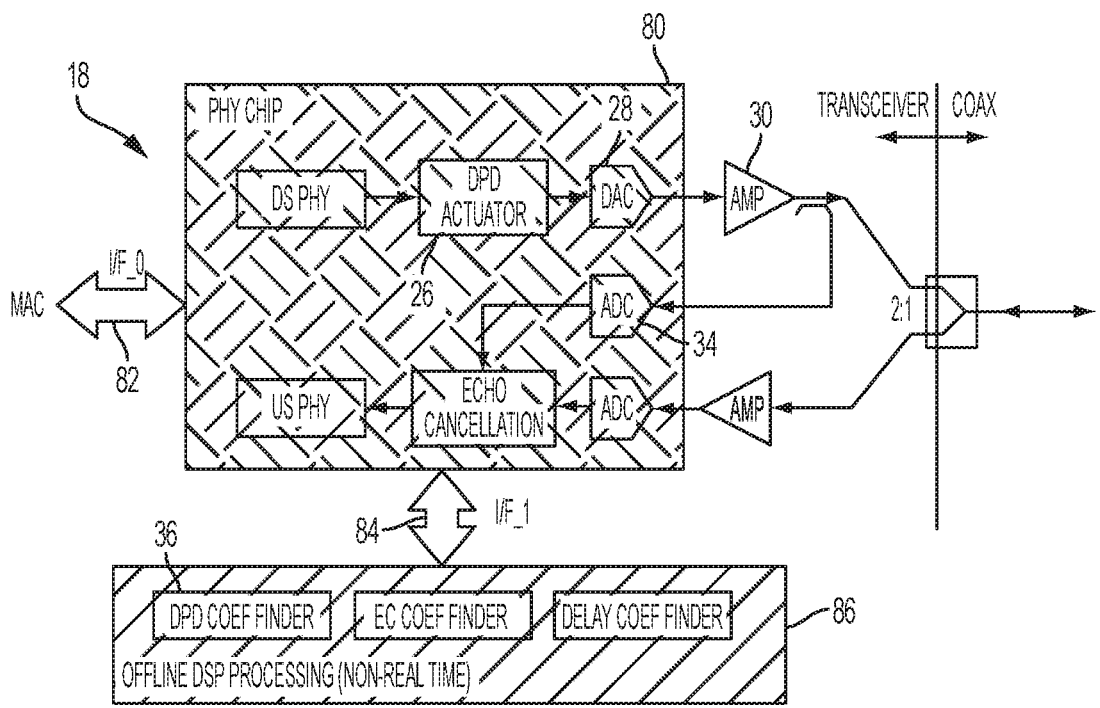
FIG. 8 is a simplified block diagram illustrating yet other example details of embodiments of the communication system.

Turning to FIG. 8, FIG. 8 is a simplified diagram illustrating example details of amplifier module 20 at transceiver 18 according to an embodiment of communication system 10. A PHY chip 80 may present two interfaces 82 and 84. Note that PHY chip 80 follows appropriate cable communication protocol specifications (e.g., ECMA, DOCSIS, etc.) and presents interfaces 82 and 84 accordingly. Interface 82 may be used to communicate with MAC components elsewhere in the system. For example, interface 82 may present appropriate ports for communicating data, control messages (e.g., to control operations of PHY chip 80) and management messages (e.g., to access registers in PHY chip 80) between PHY and MAC in cable network 12.

Interface 84 may be used to communicate with DPD coef finder 36 integrated into a DSP 86. Interface 84 may comprise ports for communicating data between PHY chip 80 and DSP 86. Interface 84 comprises a bi-directional interface for data communication between PHY chip 80 and off line DSP 86. Interface 84 carries data from PHY chip 80 to DSP 86 for coefficient calculations, and carries the updated coefficients back to PHY chip 80. In some embodiments, interface 84 may facilitate direct memory access (DMA), inter-process communication (IPC), and other fast communication mechanisms. PHY chip 80 may include various other components, which are used in full duplex communications. The other components, by way of examples and not as limitations, can include downstream (DS) PHY module, DAC 28, ADC 34 (and other ADCs), echo cancellation module, and US PHY module. Offline DSP 86 may perform computations besides the DPD coefficient calculations, for example, computing echo cancellation coefficients, delay coefficients, etc., used in operations unrelated to amplifier linearity considerations.

Figure 9:
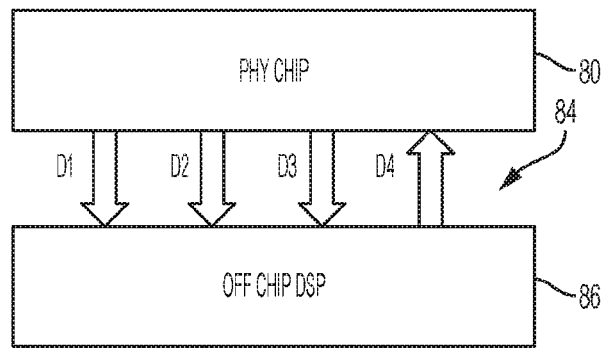
FIG. 9 is a simplified block diagram illustrating yet other example details of embodiments of the communication system.

Turning to FIG. 9, FIG. 9 is a simplified diagram illustrating example details of interface 84 at transceiver 18 according to an embodiment of communication system 10. PHY chip 80 may be connected to and communicate with off-chip DSP 86 over interface 84. Interface 84 may comprise at least three data channels (e.g., ports) for transferring data from PHY chip 80 to DSP 86. The three data channels D1, D2, and D3 may be used for providing inputs related to computing respectively, DPD coefficients, echo cancellation coefficients, and delay coefficients for facilitating communication in cable network 12. In some embodiments, D1 comprises downstream (DS) data in RF domain before conversion to digital domain. D1 may communicate real numbers, comprising a series of disjointed DS data blocks. In an example embodiment, the size of data blocks is approximately 1 MB (can be smaller) and do not need be equal. The block spacing can be large (to reduce the throughput) and is not necessarily consistent over time. A fourth data channel D4 may be used for communicating the computed coefficients to PHY chip 80. In some embodiments, the different coefficients may be differentiated on the single data channel according to signal clocks, or other suitable differentiating parameters.

In some embodiments, D1, D2 and D3 may be used to carry different types of packets running between PHY chip 80 and off chip DPD coef finder 36: Type 1: DS data before conversion to digital domain in normal TX data path [Direction: PHY chip 80 to off-chip DSP 86]; Type 2: DS data after conversion to digital domain in DS reference path [Direction: PHY chip 80 to off-chip DSP 86]; Type 3: DPD coef 42 [Direction: off-chip DSP 86 to PHY chip 80]. The 3 types of packets can be sent with a very low rate in non-real time.

Figure 10:
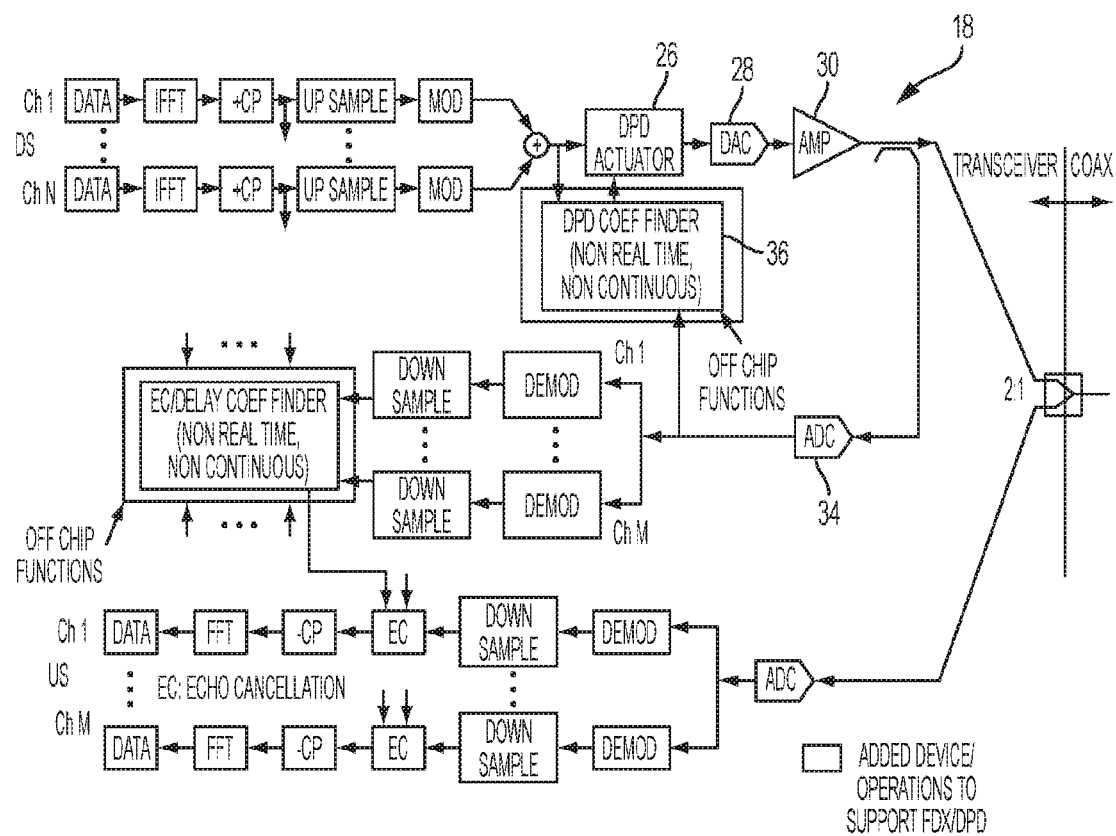
FIG. 10 is a simplified block diagram illustrating yet other example details of embodiments of the communication system.

Turning to FIG. 10, FIG. 10 is a simplified diagram illustrating example details of transceiver 18 according to an embodiment of communication system 10. Transceiver 18 may include various components for performing operations according to DOCSIS specifications, including N channels of data (e.g., RF signal separated into N channels), echo cancellation computations, and suitable Ethernet and coaxial cables for communicating with the rest of cable network 12. For example, input signal received from MAC components at transceiver 18 may be separated into N channels in the digital domain, up-sampled, and sent through DPD actuator 26. The amplified signal out of amplifier 30 may be used by DPD coef finder 36 to perform off-line non-real time computations of DPD coef 42 according to mechanisms described herein. The calculated DPD coef 42 may be provided to DPD actuator 26 and stored therein. In many embodiments, DPD coef finder 36 may be implemented in an off-line DSP (e.g., DSP 86), separate from other components shown in the figure.

Figure 11:
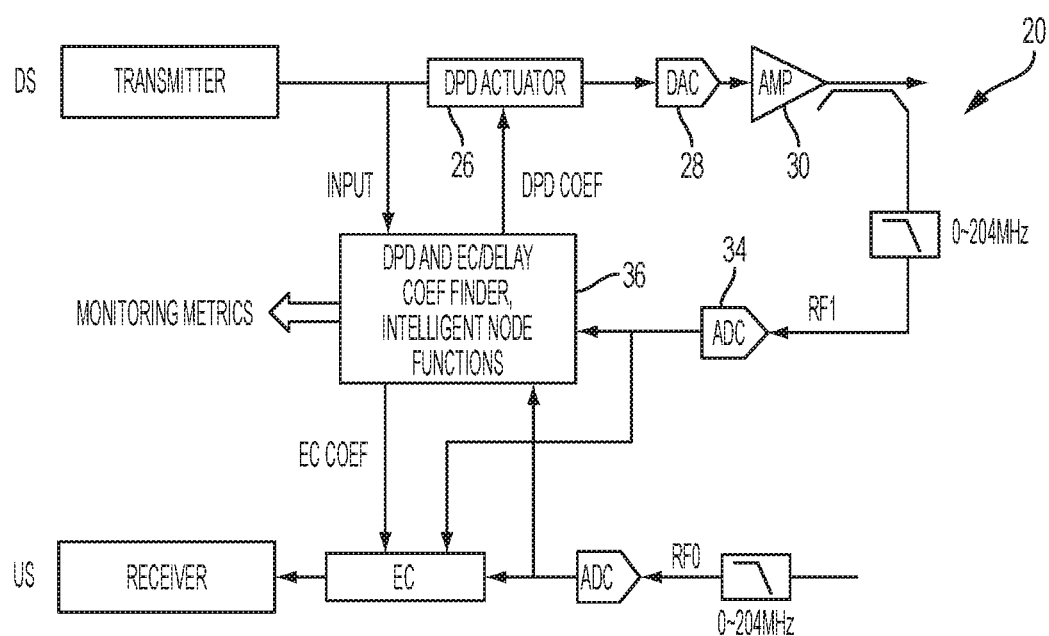
FIG. 11 is a simplified block diagram illustrating yet other example details of embodiments of the communication system.

Turning to FIG. 11, FIG. 11 is a simplified diagram illustrating example details of transceiver 18 according to an embodiment of communication system 10. In some embodiments, both echo cancellation and predistortion of input signal by DPD actuator 26 are performed in real time. For example, assume that the DPD comprises a two-point linear interpolation in RF domain with real numbers, and assuming the DAC sampling rate is ~4 Gsps (for 1.2 GHz signal BW), 20G adders (e.g., each interpolation corresponds to 2 multiples and 1 addition, indicating 5 adders) per second may be used. In an example embodiment, the DPD functionality may support a 204 MHz upstream spectrum.

Figure 12:
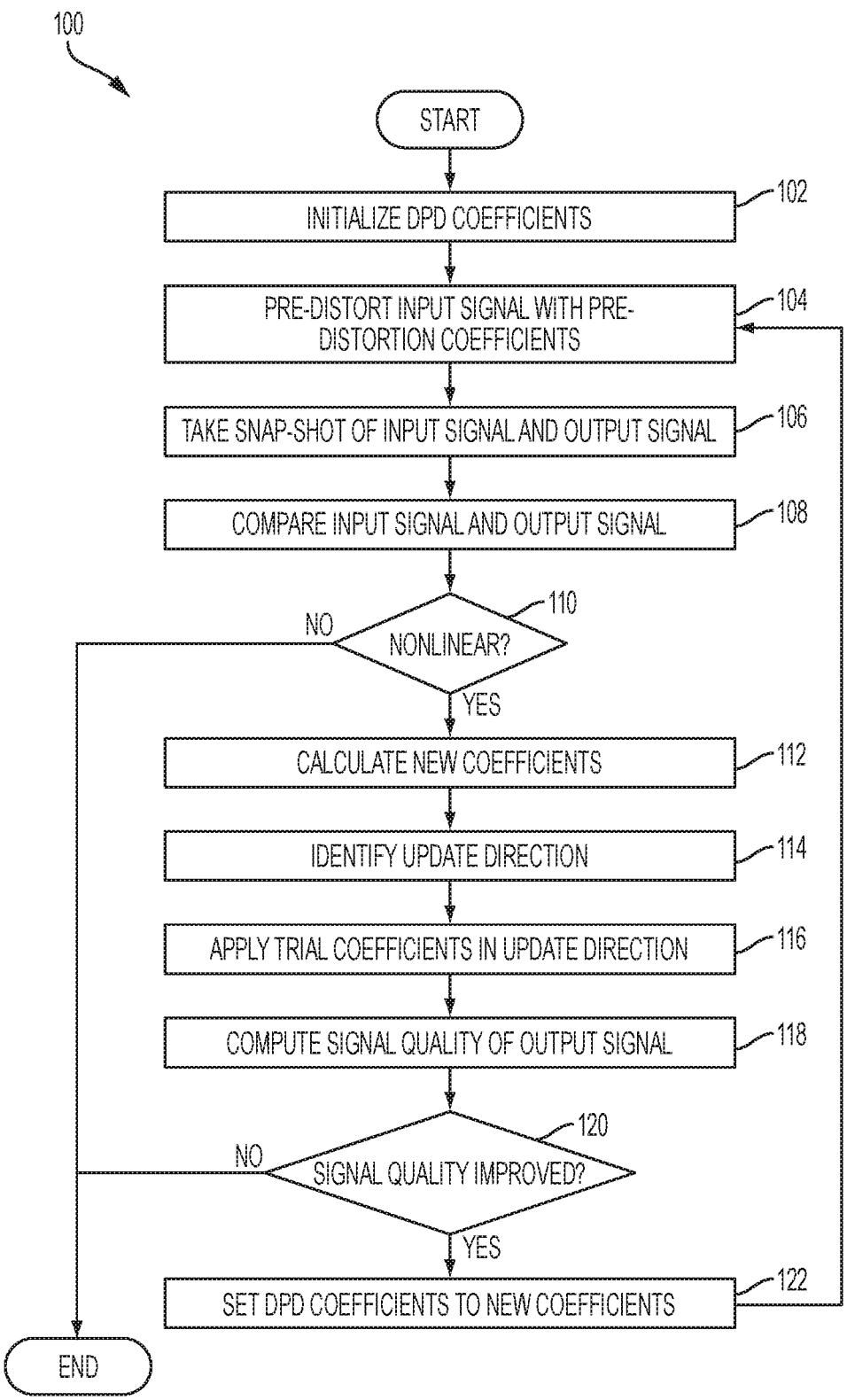
FIG. 12 is a simplified flow diagram illustrating example operations that may be associated with embodiments of the communication system.

Turning to FIG. 12, FIG. 12 is a simplified flow diagram illustrating operations 100 that are associated with embodiments of communication system 10. At 102, DPD coef 42 are initialized. For example, a value of 1 may be arbitrarily provided, such that input signal 40 is not substantially predistorted by the initialized DPD coef 42. At 104, input signal 40 is predistorted by DPD coef 42 at DPD actuator 26, and passed through DAC 28 and amplifier 30. At 106, a snap shot (e.g., sample) of input signal 40 is taken (e.g., during a pre-determined time interval); another snap shot of output signal 50 is also taken. At 108, the snap shots are compared. At 110 a determination is made as to whether any nonlinearity exists in the compared snap shot. If a nonlinearity exists, as it will if input signal 40 is not predistorted appropriately to cancel out the distortions introduced by amplifier 30, at 112, new DPD coefficients (e.g., v1) are calculated (e.g., v0 being the old DPD coefficients calculated previously).

At 114, an update direction is identified, for example, as a subspace orthogonal to the old DPD coefficients (e.g., subspace comprises a vector space that is wholly contained in another vector space; two subspaces S1 and S2 are said to be orthogonal if the dot product v1·v2=0 for all v1∈S1 and all v2∈S2). At 116, trial coefficients are applied in the update direction, the trial coefficients being components of the new DPD coefficients in the update direction (e.g., projection of v1 on v0 is computed, and components of v1 in sub-space orthogonal to v0 is computed as v1s; trial coefficients are set to be a weighted component of v1l and the projection of v1 on v0). At 118, the signal quality of output signal 50 is measured.

At 120, a determination is made whether the signal quality improved from previous measurements. If the signal quality is improved, at 122, DPD coef 42 are set to the trial coefficients. Otherwise, the operations end, reverting to the previously set DPD coef 42. Turning back to 110, if the input signal is appropriately pre-distorted, nonlinearities in output signal is negated (or within a tolerance level), and the operations may end thereupon.

Figure 13:
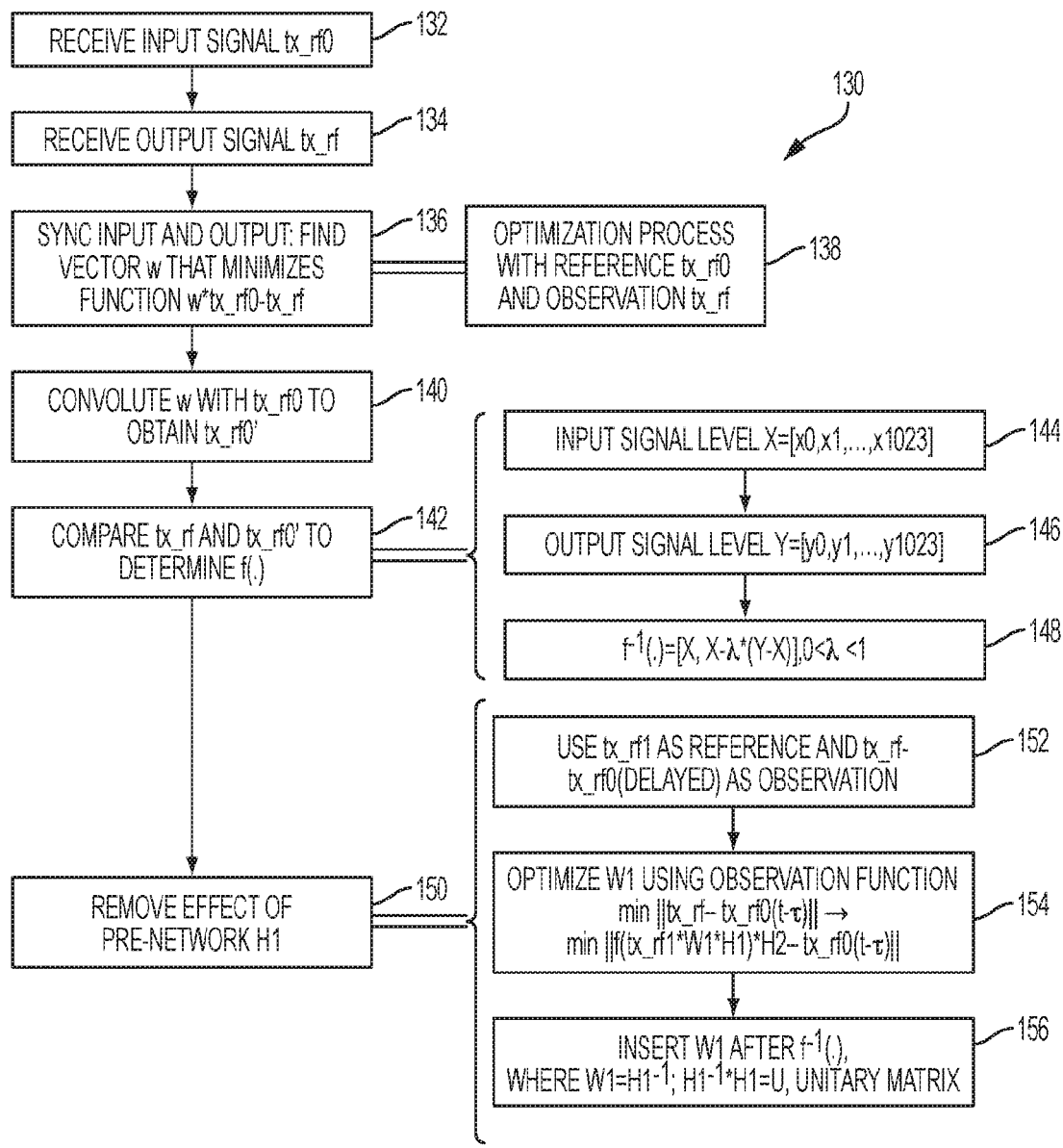
FIG. 13 is a simplified flow diagram illustrating other example operations that may be associated with embodiments of the communication system.

Turning to FIG. 13, FIG. 13 is a simplified flow diagram illustrating example operations 130 that may be associated with embodiments of communication system 10. At 132, input signal tx_rf0 is received at DPD coef finder 36. At 134, output signal tx_rf is received at DPD coef finder 36. Note that the terms "input signal" and "output signal" are made with reference to signals entering and exiting out of amplifier module 20 along main line 76. At 136, input signal and output signal are synchronized by finding a vector w that minimizes function w*tx_rf0−tx_rf, where * refers to convolution operation, which is well known in the art. Physically, w is equivalent to a virtual network that behaves exactly as the combination of channel effects H1 and H2. The output of the virtual network will be the same as tx_rf but for nonlinearity f(.). Vector w may be found using any well-known optimization process at 138, with reference tx_rf0 and observation tx_rf, w being the coefficient sought in the optimization process. The optimization process can comprise a regression analysis in some embodiments. For example, if regressive least squares (RLS) is used, tx_rf0 may be considered as reference X={x(i); i=0, 1, 2, ... 1023} and tx_rf may be considered as observation Y={y(i); i=0, 1, 2, ... 1023}, and the RLS algorithm seeks to find recursively in time parameters $\{w_0(i), w_1(i), \ldots, w_{M-1}(i)\}$ such as to minimize an error function given as $\Sigma_{k=0}^{M-1} w_k(i)x(i-k)-y(i)$; i=0, 1, 2, ... 1023.

At 140, vector w is convoluted with tx_rf0 to obtain tx_rf0'. At 142, tx_rf and tx_rf0' are compared to determine f(.), the nonlinearity of amplifier 30. In an example embodiment, f(.) may be determined as follows. At 144, input signal level X is denoted as a matrix X=[x0, x1, x2, ... x1023]. At 146, output signal level Y is denoted as another matrix Y=[y0, y1, y2, ... y1023]. At 148, an inverse function $f^{-1}(.)$ is calculated as $f^{-1}(.)=[X, X-\lambda*(Y-X)], 0<\lambda<1$.

At 150, effects of pre-network CIR H1 is removed as follows. At 152, use tx_rf1 (which is the same as tx_rf subjected to $f^{-1}(.)$) as reference and tx_rf(t)−tx_rf0(t−τ) as observation. At 154, using tx_rf1 as the reference and tx_rf−tx_rf0(delayed) as the observation, a function W1 is optimized using the following objective function:

$$\min \|tx\_rf - tx\_rf0(t-\tau)\|$$

which can also be written as:

$$\min \|f(tx\_rf1 * W1 * H1) * H2 - tx\_rf0(t-\tau)\|$$

where * stands for convolution function, and f(.) represents amplifier non-linearity. At 156, W1 is inserted after $f^{-1}(.)$, where W1=H1$^{-1}$; H1$^{-1}$*H1=U, UNITARY MATRIX.

Figure 14:
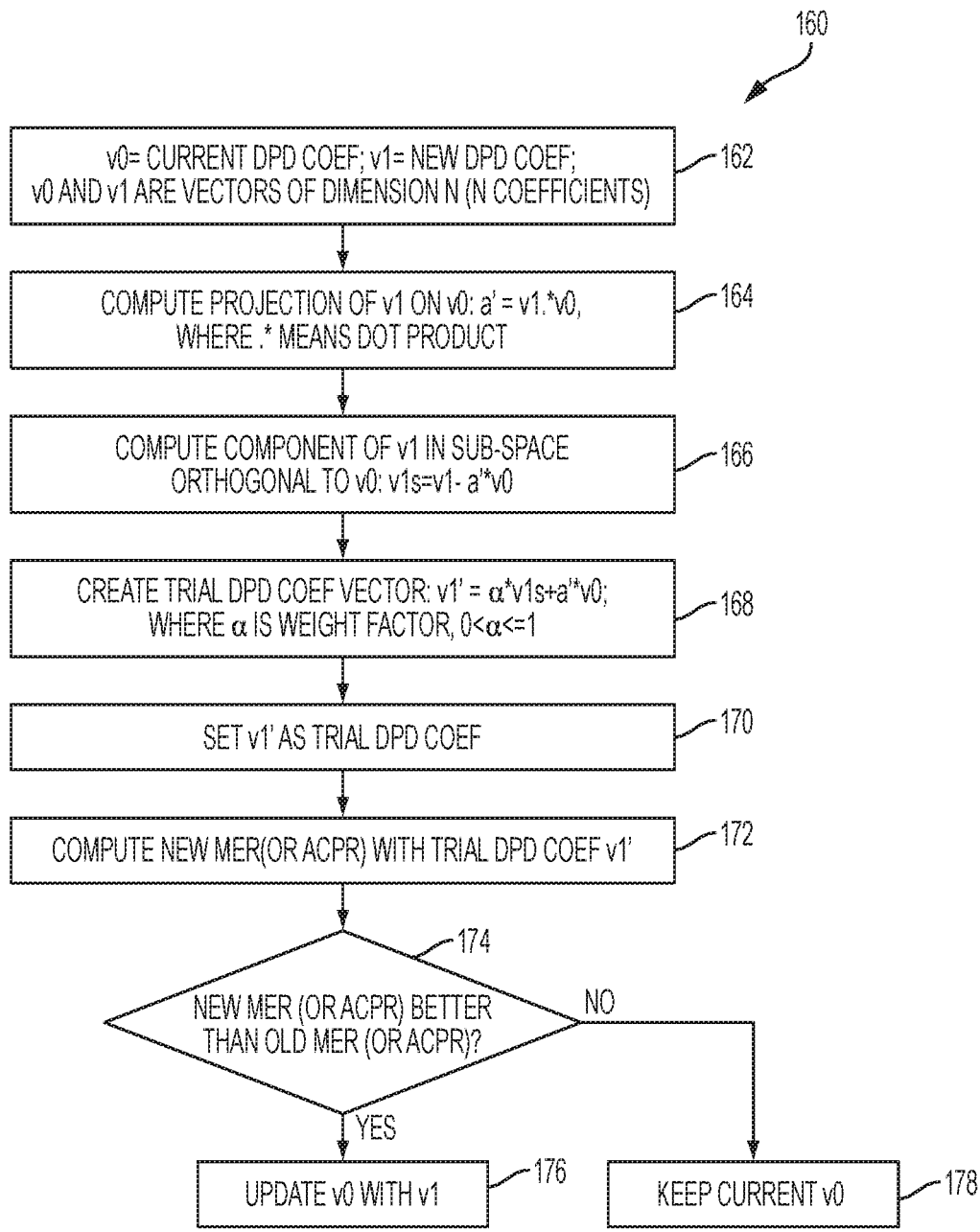
FIG. 14 is a simplified flow diagram illustrating yet other example operations that may be associated with embodiments of the communication system.

Turning to FIG. 14, FIG. 14 is a simplified flow diagram illustrating example operations 160 according to embodiments of communication system 10. At 162, denote current DPD coef 42 as v0, and new coef as v1. Both v0 and v1 are vectors of dimension N (e.g., with N coefficients). At 164, a projection of v1 on v0 is computed as: a'=v1.*v0, where .* means dot product. At 166, a component of v1 in a sub-space that is orthogonal to v0 is computed as: v1s=v1−a'*v0. At 168, trial DPD coef vector v1' is computed as v1'=α*v1s+a'*v0, where α is a weight factor, 0<α<=1. At 170, v1' is used as DPD coef 42 and applied it to the system. At 172, new MER (or ACPR) with trial DPD coef v1' is computed. At 174, a determination is made whether new MER (ACPR) is better than old MER (ACPR). If so, at 176, v0 is updated to v1', otherwise, at 178, v0 is retained without any change in value.

Turning to FIG. 15, FIG. 15 is a simplified MATLAB® algorithm 180 illustrating delay calculations by DPD coef finder 36. In various embodiments, due to the effects of CIRs H1 and H2, there are no resemblances between input signal and output signal. The non-linearity of amplifier 30 is masked by the channel effects. When input signal and output signal are synchronized, for example, with delays removed, any difference between input signal and output signal indicates nonlinearity of amplifier 30.

Turning to FIG. 16, FIG. 16 is a simplified MATLAB® algorithm 182 illustrating calculation of w by DPD coef finder 36. w represents channel effects (e.g., CIR H1 and CIR H2). w is calculated using an optimization process (e.g., linear regression, recursive least square (RLS)). The reference used in the linear regression is the tx_rf0, and the observation is the tx_rf, and w is the coefficient sought. w approximates linear the channel effects between tx_rf0 and tx_rf.

Turning to FIG. 17, FIG. 17 shows simplified MATLAB® algorithms 183 and 184 illustrating respectively, synchronizing of input and output signals and updating of vector w as implemented in w module 60 and optimizer 62.

Turning to FIG. 18, FIG. 18 is a simplified MATLAB® algorithm 186 illustrating synchronizing of input and output signals by DPD coef finder 36. After w, representing channel effects is calculated, tx_rf0 is convoluted with w, which means that tx_rf0 is processed through a virtual network that represents linear networks between sampling points of tx_rf0 and tx_rf. The output of the virtual network is denoted as tx_rf0'. The differences between tx_rf0' and tx_rf represents the nonlinearity of amplifier 30.

Turning to FIG. 19, FIG. 19 is a simplified MATLAB® algorithm 188 illustrating calculation of nonlinear function f(.) of amplifier 30 by DPD coef finder 36. The nonlinearity is computed by compared tx_rf0' and tx_rf. Note that f(.) is denoted as tx_coef1 in algorithm 188. Other variables used by the algorithm are specified appropriately internally.

Turning to FIG. 20, FIG. 20 is a simplified MATLAB® algorithm 190 illustrating calculation of DPD coef 42 by DPD coef finder 36 from nonlinear function f(.) of amplifier 30. In various embodiments, the amplifier nonlinearity is characterized with the input-output signal level relationship in 2×1024 format:

$$X=[x0,x1,\ldots,x1023]; Y=[y0,y1,\ldots,y1023];$$

where xi, i=0,1, . . . ,1023 are the input signal level (real numbers), and yi, i=0,1, . . . ,1023 are the output signal level (real numbers). xi, i=0,1, . . . ,1023 are evenly spaced. At each input level xi (i=0,1, 2, . . . , 1023), multiple output level observations due to noise are averaged to give the corresponding yi (i=0,1, 2, . . . , 1023). f−1(.) is obtained by inverting the nonlinearity curve:

$$f^{-1}(.)=[X,X-\lambda*(Y-X)]$$

where λ is a damping factor, 0<λ<=1.

Figures 21, 22:
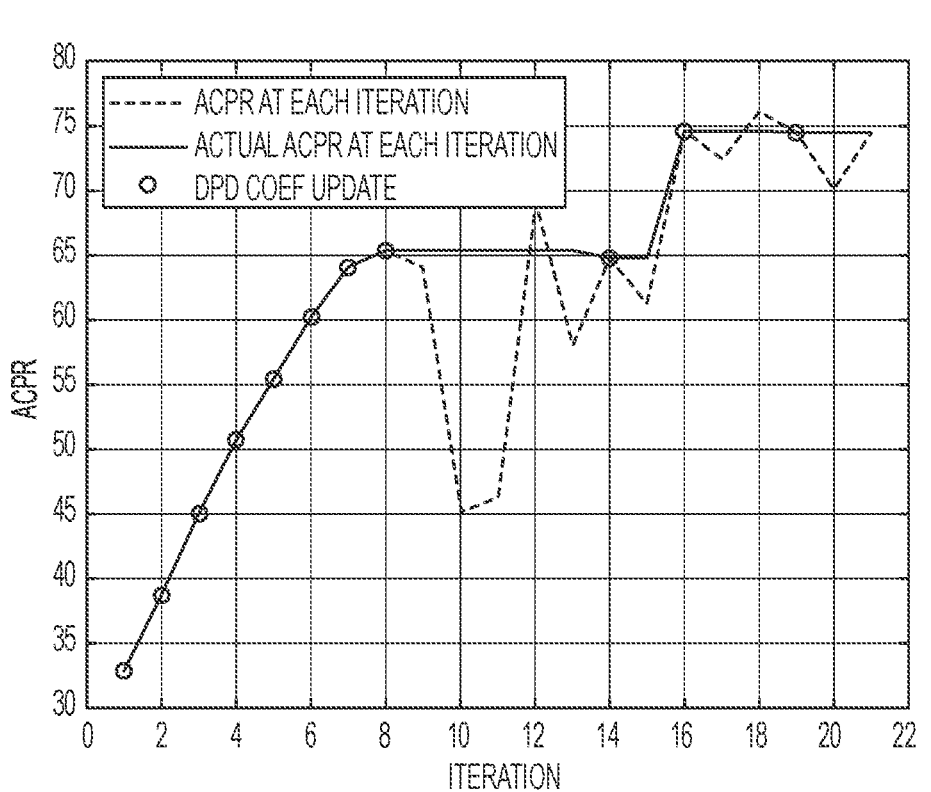
FIG. 21 is a simplified algorithm illustrating yet other example operations that may be associated with embodiments of the communication system.
FIG. 22 is a simplified diagram illustrating yet other example details that may be associated with embodiments of the communication system.

Turning to FIG. 21, FIG. 21 is a simplified MATLAB® algorithm 192 illustrating machine learning by DPD coef finder 36. Denote the current DPD coef as v0 (which is dpd_coef in algorithm 192), and new coef as v1 (which is dpd_coef1 in algorithm 192). Both v0 and v1 are vectors of dimension N (N coefficients). A projection of v1 on v0 is computed as: a'=v1.*v0, where .* means dot product (and a' is denoted as a1 in algorithm 192). A component of v1 in a sub-space that is orthogonal to v0 is computed as: v1s=v1−a'*v0. A trial DPD coef vector is computed as v1'=α*v1s+a'*v0, where α is a weight factor, 0<α<=1 (v1' is denoted as dpd_coef_trial in algorithm 192). In various embodiments, v1' is used as DPD coef 42 and applied it to the system. A new MER (or ACPR) with trial DPD coef v1' is computed. If new MER (ACPR) is better than old MER (ACPR), v0 is updated to v1', otherwise, v0 is retained without any change in value.

Turning to FIG. 22, FIG. 22 is a simplified diagram illustrating a graph 194 of ACPR of the output signal versus number of iterations of DPD coefficient calculations. Simulations indicate that before DPD correction, a Class AB amplifier had less than 35 dB ACPR. Using DPD correction according to the operations described herein, ACPR was improved by more than 70 dB after 20 iterations.

Figure 23:
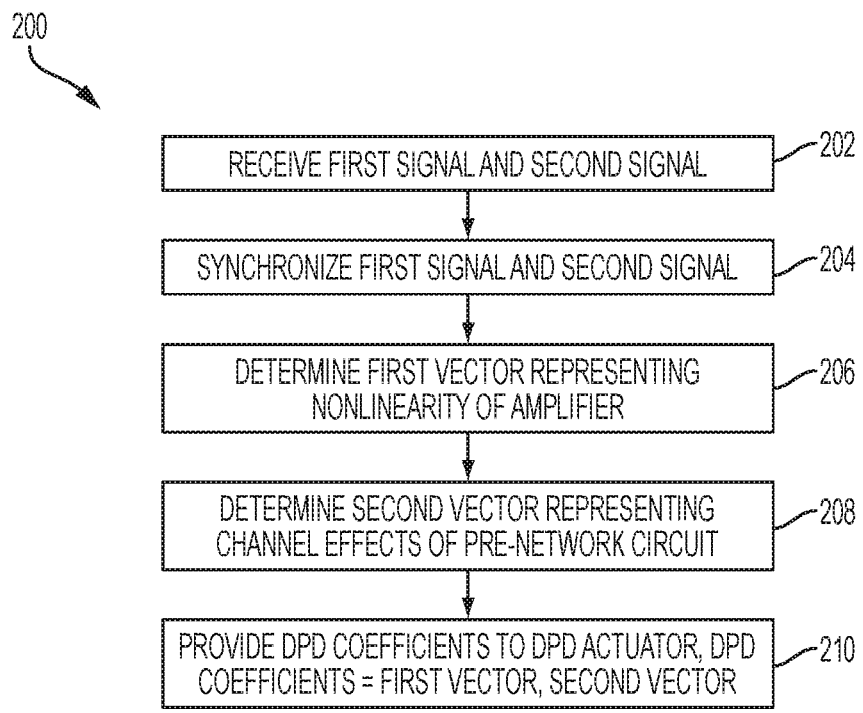
FIG. 23 is a simplified flow diagram illustrating yet other example operations that may be associated with embodiments of the communication system.

Turning to FIG. 23, FIG. 23 is a simplified flow diagram illustrating example operations 200 that may be associated with an embodiment of communication system 10. At 202, DPD coef finder 36 receives a first signal (tx_rf0) and a second signal (tx_rf), the first signal being transformed into the second signal after being passed in sequence through pre-network circuit 56, amplifier 30, and post-network circuit 58, wherein pre-network circuit 56 and post-network circuit 58 introduces distortions due to channel effects (H1 and H2, respectively) and amplifier 30 introduces distortions due to nonlinearity. At 204, DPD coef finder 36 synchronizes the first signal with the second signal to remove the channel effects H1 and H2 of corresponding pre-network circuit 56 and post network circuit 58. At 206, DPD coef finder 36 determines a first vector (f$^{-1}$(.)) representing an inverse of the nonlinearity of amplifier 30. At 208, DPD coef finder 36 determines a second vector (W1) representing an inverse of the channel effects H1 of pre-network circuit 56. At 210, DPD coef finder 36 provides DPD coef 42 to DPD actuator 26, DPD coef 42 comprising the first vector and the second vector. DPD actuator 26 predistorts input signals to amplifier module 20 using DPD coef 42, such that corresponding output signals from amplifier module 20 retains linearity relative to the input signals.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Furthermore, the words "optimize," "optimization," and related terms are terms of art that refer to improvements in speed and/or efficiency of a specified outcome and do not purport to indicate that a process for achieving the specified outcome has achieved, or is capable of achieving, an "optimal" or perfectly speedy/perfectly efficient state.

In example implementations, at least some portions of the activities outlined herein may be implemented in software in, for example, amplifier module 20, and transceiver 18. In some embodiments, one or more of these features may be implemented in hardware, provided external to these elements, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Furthermore, amplifier module 20, and transceiver 18 described and shown herein (and/or their associated structures) may also include suitable interfaces for receiving, transmitting, and/or otherwise communicating data or information in a network environment. Additionally, some of the processors and memory elements associated with the various nodes may be removed, or otherwise consolidated such that a single processor and a single memory element are responsible for certain activities. In a general sense, the arrangements depicted in the FIGURES may be more logical in their representations, whereas a physical architecture may include various permutations, combinations, and/or hybrids of these elements. It is imperative to note that countless possible design configurations can be used to achieve the operational objectives outlined here. Accordingly, the associated infrastructure has a myriad of substitute arrangements, design choices, device possibilities, hardware configurations, software implementations, equipment options, etc.

In some of example embodiments, one or more memory elements (e.g., memory element comprised in DPD actuator 26, DPD coef finder 36) can store data used for the operations described herein. This includes the memory element being able to store instructions (e.g., software, logic, code, etc.) in non-transitory media, such that the instructions are executed to carry out the activities described in this Specification. A processor can execute any type of instructions associated with the data to achieve the operations detailed herein in this Specification. In one example, processors (e.g., processor comprised in DPD actuator 26, DPD coef finder 36) could transform an element or an article (e.g., data, or electrical signals) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

These devices may further keep information in any suitable type of non-transitory storage medium (e.g., random access memory (RAM), read only memory (ROM), field programmable gate array (FPGA), erasable programmable read only memory (EPROM), electrically erasable programmable ROM (EEPROM), etc.), software, hardware, or in any other suitable component, device, element, or object where appropriate and based on particular needs. The information being tracked, sent, received, or stored in communication system 10 could be provided in any database, register, table, cache, queue, control list, or storage structure, based on particular needs and implementations, all of which could be referenced in any suitable timeframe. Any of the memory items discussed herein should be construed as being encompassed within the broad term 'memory element.' Similarly, any of the potential processing elements, modules, and machines described in this Specification should be construed as being encompassed within the broad term 'processor.'

It is also important to note that the operations and steps described with reference to the preceding FIGURES illustrate only some of the possible scenarios that may be executed by, or within, the system. Some of these operations may be deleted or removed where appropriate, or these steps may be modified or changed considerably without departing from the scope of the discussed concepts. In addition, the timing of these operations may be altered considerably and still achieve the results taught in this disclosure. The preceding operational flows have been offered for purposes of example and discussion. Substantial flexibility is provided by the system in that any suitable arrangements, chronologies, configurations, and timing mechanisms may be provided without departing from the teachings of the discussed concepts.

Although the present disclosure has been described in detail with reference to particular arrangements and configurations, these example configurations and arrangements may be changed significantly without departing from the scope of the present disclosure. For example, although the present disclosure has been described with reference to particular communication exchanges involving certain network access and protocols, communication system 10 may be applicable to other exchanges or routing protocols. Moreover, although communication system 10 has been illustrated with reference to particular elements and operations that facilitate the communication process, these elements, and operations may be replaced by any suitable architecture or process that achieves the intended functionality of communication system 10.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A method executed at a digital predistortion (DPD) coefficient finder of an amplifier module in a cable network, the method comprising:
   receiving a first signal and a second signal at the DPD coefficient finder, wherein the second signal comprises a transformation of the first signal including distortions due to channel effects and distortions due to amplifier nonlinearity, the first signal being transformed into the second signal after being passed in sequence through a pre-network circuit, an amplifier, and a post-network circuit, wherein the pre-network circuit and the post-network circuit introduce the distortions due to channel effects and the amplifier introduces the distortions due to amplifier nonlinearity;
   synchronizing the first signal and the second signal, wherein the synchronizing removes the channel effects of the pre-network circuit and the post-network circuit from the second signal, wherein the synchronizing comprises finding a vector w representative of a combination of the channel effects;
   computing a first vector representing an inverse of the nonlinearity of the amplifier based on the vector w;
   computing a second vector representing an inverse of the channel effects of the pre-network circuit based on the first vector; and
   providing DPD coefficients to a DPD actuator in the amplifier module, wherein the DPD coefficients comprise the first vector and the second vector, wherein the DPD actuator predistorts an input signal to the amplifier module with the DPD coefficients, wherein an output signal from the amplifier module retains linearity relative to the input signal.

2. The method of claim 1, wherein the first signal comprises a sample of the input signal.

3. The method of claim 1, wherein the input signal is predistorted in real time with the DPD coefficients, wherein the DPD coefficients are updated periodically offline in non-real time.

4. The method of claim 3, wherein the updating is performed at least at one of preconfigured intervals, change in network conditions, and change in environmental conditions.

5. The method of claim 3, wherein updating the DPD coefficients comprises:
   computing new DPD coefficients;
   calculating trial coefficients, comprising a portion of the new DPD coefficients;
   applying the trial coefficients to the input signal;
   measuring signal quality of the output signal;
   if the signal quality is improved, updating old DPD coefficients with the new DPD coefficients, wherein the old DPD coefficients are stored values from a previous computation; and
   if the signal quality is not improved, retaining the old DPD coefficients without updating.

6. The method of claim 5, wherein calculating the trial coefficients comprises:
   computing a projection of the new DPD coefficients on the old DPD coefficients;

computing a component of the new DPD coefficients in a subspace orthogonal to the old DPD coefficients; and setting the trial coefficients as a sum of a weighted factor of the orthogonal subspace component and the projection.

7. The method of claim 1, wherein the first signal and the second signal comprise digital signals.

8. Non-transitory tangible computer-readable media that includes instructions for execution, which when executed by a processor, is operable to perform operations comprising:

receiving a first signal and a second signal at the DPD coefficient finder, wherein the second signal comprises a transformation of the first signal including distortions due to channel effects and distortions due to amplifier nonlinearity, the first signal being transformed into the second signal after being passed in sequence through a pre-network circuit, an amplifier, and a post-network circuit, wherein the pre-network circuit and the post-network circuit introduce the distortions due to channel effects and the amplifier introduces the distortions due to amplifier nonlinearity;

synchronizing the first signal and the second signal, wherein the synchronizing removes the channel effects of the pre-network circuit and the post-network circuit from the second signal, wherein the synchronizing comprises finding a vector w representative of a combination of the channel effects;

computing a first vector representing an inverse of the nonlinearity of the amplifier based on the vector w;

computing a second vector representing an inverse of the channel effects of the pre-network circuit based on the first vector; and providing DPD coefficients to a DPD actuator in the amplifier module, wherein the DPD coefficients comprise the first vector and the second vector, wherein the DPD actuator predistorts an input signal to the amplifier module with the DPD coefficients, wherein an output signal from the amplifier module retains linearity relative to the input signal.

9. The media of claim 8, wherein the input signal is predistorted in real time with the DPD coefficients, wherein the DPD coefficients are updated periodically offline in non-real time.

10. The media of claim 9, wherein updating the DPD coefficients comprises:

computing new DPD coefficients;

calculating trial coefficients, comprising a portion of the new DPD coefficients;

applying the trial coefficients to the input signal;

measuring signal quality of the output signal;

if the signal quality is improved, updating old DPD coefficients with the new DPD coefficients, wherein the old DPD coefficients are stored values from a previous computation; and if the signal quality is not improved, retaining the old DPD coefficients without updating.

11. The media of claim 10, wherein calculating the trial coefficients comprises:

computing a projection of the new DPD coefficients on the old DPD coefficients;

computing a component of the new DPD coefficients in a subspace orthogonal to the old DPD coefficients; and setting the trial coefficients as a sum of a weighted factor of the orthogonal subspace component and the projection.

12. An apparatus, comprising:

a DPD actuator connected at least to an input of the apparatus;

a digital to analog converter (DAC) connected to an output of the DPD actuator;

an amplifier connected to an output of the DAC;

an analog-to-digital converter (ADC) connected to an output of the amplifier; and a DPD coefficient finder connected to the input of the apparatus and an output of the ADC, wherein an output of the DPD coefficient finder is connected to the DPD actuator, wherein the DPD coefficient finder comprises a memory for storing data, and a processor operable to execute instructions associated with the data, wherein the processor and the memory cooperate, such that the apparatus is configured for:

receiving a first signal and a second signal at the DPD coefficient finder, wherein the second signal comprises a transformation of the first signal including distortions due to channel effects and distortions due to amplifier nonlinearity, the first signal being transformed into the second signal after being passed in sequence through a pre-network circuit, the amplifier, and a post-network circuit, wherein the pre-network circuit and the post-network circuit introduce the distortions due to channel effects and the amplifier introduces the distortions due to amplifier nonlinearity;

synchronizing the first signal and the second signal, wherein the synchronizing removes the channel effects of the pre-network circuit and the post-network circuit from the second signal, wherein the synchronizing comprises finding a vector w representative of a combination of the channel effects;

computing a first vector representing an inverse of the nonlinearity of the amplifier based on the vector w;

computing a second vector representing an inverse of the channel effects of the pre-network circuit based on the first vector; and providing DPD coefficients to the DPD actuator, wherein the DPD coefficients comprise the first vector and the second vector, wherein the DPD actuator predistorts an input signal to the apparatus with the DPD coefficients, wherein an output signal from the apparatus retains linearity relative to the input signal.

13. The apparatus of claim 12, wherein the input signal is predistorted in real time with the DPD coefficients, wherein the DPD coefficients are updated periodically offline in non-real time.

14. The apparatus of claim 13, wherein updating the DPD coefficients comprises:

computing new DPD coefficients;

calculating trial coefficients, comprising a portion of the new DPD coefficients;

applying the trial coefficients to the input signal;

measuring signal quality of the output signal;

if the signal quality is improved, updating old DPD coefficients with the new DPD coefficients, wherein the old DPD coefficients are stored values from a previous computation; and if the signal quality is not improved, retaining the old DPD coefficients without updating.

15. The apparatus of claim 14, wherein calculating the trial coefficients comprises:

computing a projection of the new DPD coefficients on the old DPD coefficients;

computing a component of the new DPD coefficients in a subspace orthogonal to the old DPD coefficients; and setting the trial coefficients as a sum of a weighted factor of the orthogonal subspace component and the projection.

16. The apparatus of claim 12, wherein the DPD coefficient finder, the DPD actuator, the DAC and the ADC are implemented in an integrated circuit and connected to the amplifier externally.

17. The apparatus of claim 12, where the DPD actuator is integrated into a physical interface (PHY) module of a cable network in a first integrated circuit, wherein the DPD coefficient finder is implemented in a second integrated circuit, wherein the first integrated circuit is connected to the DAC and the second integrated circuit.

18. The apparatus of claim 12, wherein the DPD actuator, the DAC, and the ADC are integrated into PHY module of a cable network in a first integrated circuit, and the DPD coefficient finder is implemented in a second integrated circuit, wherein the first integrated circuit is connected to the amplifier and the second integrated circuit.

19. The apparatus of claim 18, wherein the DPD coefficient finder is integrated with other computation modules into a digital signal processor (DSP), wherein the DSP computes the DPD coefficients off-line.

20. The apparatus of claim 18, wherein the first integrated circuit and the second integrated circuit are connected over a data interface permitting a plurality of types of data to be exchanged between the first integrated circuit and the second integrated circuit.

\* \* \* \* \*